(12) United States Patent
Khusnatdinov

(10) Patent No.: US 10,725,375 B2
(45) Date of Patent: Jul. 28, 2020

(54) USING NON-LINEAR FLUID DISPENSERS FOR FORMING THICK FILMS

(71) Applicant: CANON KABUSHIKI KAISHA, Tokyo (JP)

(72) Inventor: Niyaz Khusnatdinov, Round Rock, TX (US)

(73) Assignee: Canon Kabushiki Kaisha, Tokyo (JP)

(*) Notice: Subject to any disclaimer, the term of this patent is extended or adjusted under 35 U.S.C. 154(b) by 0 days.

(21) Appl. No.: 16/209,746

(22) Filed: Dec. 4, 2018

(65) Prior Publication Data

US 2020/0174362 A1    Jun. 4, 2020

(51) Int. Cl.

| | |
|---|---|
| G03F 7/00 | (2006.01) |
| B29C 59/02 | (2006.01) |
| B41J 2/02 | (2006.01) |
| B82Y 40/00 | (2011.01) |
| B82Y 10/00 | (2011.01) |

(52) U.S. Cl.
CPC ............ *G03F 7/0002* (2013.01); *B29C 59/02* (2013.01); *B41J 2/02* (2013.01); *B82Y 10/00* (2013.01); *B82Y 40/00* (2013.01)

(58) Field of Classification Search
CPC .......... G03F 7/0002; B41J 2/02; B29C 59/02; B82Y 40/00; B82Y 10/00
See application file for complete search history.

(56) References Cited

U.S. PATENT DOCUMENTS

| | | | |
|---|---|---|---|
| 8,119,052 B2 * | 2/2012 | Schumaker | B82Y 10/00 264/293 |
| 8,586,126 B2 | 11/2013 | Schumaker | |
| RE46,901 E | 6/2018 | Matsuoka | |
| 2005/0190233 A1 | 9/2005 | Bhattacharjya | |
| 2007/0228593 A1 | 10/2007 | Jones | |

FOREIGN PATENT DOCUMENTS

| | | |
|---|---|---|
| JP | 2012238674 A | 12/2012 |
| WO | 2015166870 A1 | 5/2015 |

OTHER PUBLICATIONS

IP.com search (Year: 2019).*
Gaurav Sharma, Stochastic Screens Robust to Mis-Registration in Multi-Pass Printing, Jan 2004, pp. 460-468, IX, vol. 5293, Proc. SPIE: Color Imaging: Processing, Hardcopy, and Applications, San Jose, California.

* cited by examiner

*Primary Examiner* — Lisa Solomon
(74) *Attorney, Agent, or Firm* — Canon U.S.A., Inc. IP Division

(57) ABSTRACT

A method of controlling a control apparatus for use with a fluid dispenser having a plurality of nozzles includes obtaining, dividing, and substituting. A drop pattern is obtained as data for use in dispensing drops onto a substrate from the plurality of nozzles of the fluid dispenser. The obtained drop pattern is divided into a plurality of drop patterns based on a distance between drops of the obtained drop pattern. The plurality of drop patterns are substituted in place of the obtained drop pattern to dispense the drops onto the substrate from the fluid dispenser.

9 Claims, 20 Drawing Sheets

USING NON-LINEAR FLUID DISPENSERS FOR FORMING THICK FILMS

BACKGROUND

Field

The disclosure relates to controlling the thickness of a resist layer used in, for example, nanoimprint lithography to manufacture a semiconductor chip.

Description of the Related Art

Nanoimprint lithography (NIL) is used to make nanometer (nm) scale patterns on a substrate, including in semiconductor chip production. Since nanoimprint lithography can achieve line widths down to at least 15 nm, the process has a potential to significantly reduce production costs for semiconductor device manufacturers while increasing the speed of chips used in every day products such as home appliances, automobiles, and smartphones.

There are various technologies to form drops of resist. For example, U.S. Pat. No. 8,586,126 discloses a fluid dispenser of drops of resin having a polymerizable material to place on a substrate before imprinting. Drop-on-demand methods of nanoimprint lithography can be particularly directed towards high-volume manufacturing. In such methods, fluid dispensers (FD) such as inkjet nozzles are controlled to dispense small resist drops onto a substrate surface according to a pre-determined drop pattern. Then, when a template or mold having a relief pattern corresponding to the nano-circuit pattern is brought into direct contact with the resist material on the substrate surface, the resist drops spread and merge into a continuous resist film layer that fills the relief pattern features. Ultraviolet light or other actinic radiation then may be used to solidify the resist to form the desired resist pattern on the substrate, after which the template or mold is separated from the substrate.

SUMMARY

In nanoimprint lithography, unexpected variation in the resist layer thickness can lead to downstream process defects, including a decrease device performance and semiconductor chip yield. In this regard, the disclosure is directed to dividing a drop dispensing pattern into plural dispensing patterns to address crosstalk non-linearity influence on measured resin thickness.

According to an aspect of the present disclosure, a method of controlling a control apparatus for use with a fluid dispenser having a plurality of nozzles includes obtaining, as data, a drop pattern for use in dispensing drops onto a substrate from the plurality of nozzles of the fluid dispenser, dividing the obtained drop pattern into a plurality of drop patterns based on a distance between drops of the obtained drop pattern, and substituting, in place of the obtained drop pattern, the plurality of drop patterns to dispense the drops onto the substrate from the fluid dispenser.

Further features of the present disclosure will become apparent from the following description of embodiments with reference to the attached drawings.

DESCRIPTION OF THE EMBODIMENTS

Embodiments will hereinafter be described in detail with reference to the drawings. The embodiments do not limit the subject matter recited in the claims or the scope of that subject matter. All combinations of features described according to the embodiments are not necessarily essential to solutions.

Figure 1A:
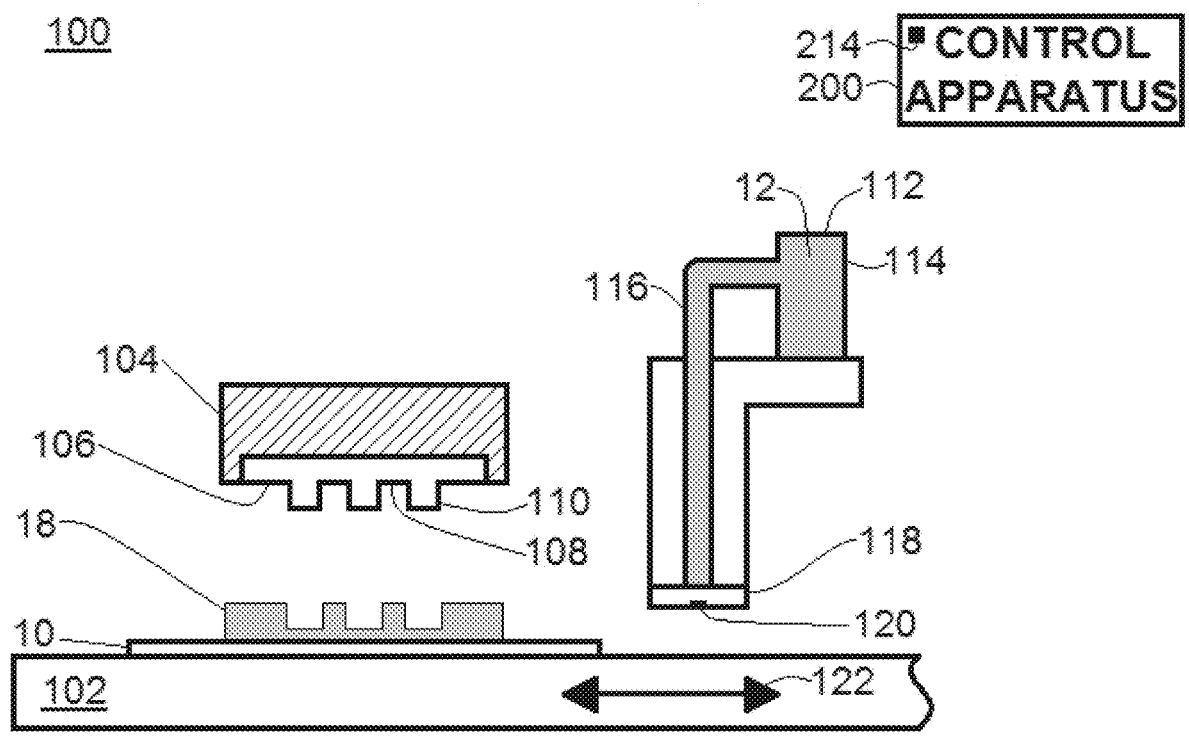
FIGS. 1A, 1B, 1C, 1D, and 1E are elevated views of a mold system 100.

FIGS. 1A to 1E are elevated views of a mold system 100. A process of forming a nano-circuit pattern layer 18 on a substrate 10 proceeds in order from FIG. 1B through FIG. 1E and ends with FIG. 1A. As illustrated in FIG. 1A, the mold system 100 may include a substrate stage 102 to hold the substrate (wafer) 10, a mold chuck 104 to hold a mold (template or mask) 106 having cavities 108 and protrusions 110, a fluid dispenser (e.g., print head) 112, and a control apparatus 200 having a drop pattern generating application 214.

In an example, the cavities 108 and protrusions 110 may be arranged as part of the mold 106 in a pattern and the substrate 10 may be a featureless (blank) substrate. It is this pattern of the mold 106 that may be transferred to the substrate 10. In an alternate example, the mold 106 may be a featureless mold and the substrate 10 may have a pattern etched into it that includes a set of lines, rectangles, ovals, and other geometry figures that may be used in a specific lithography step.

The fluid dispenser 112 may include a resin tank 114 holding resin 12 to be dispensed through supply channel 116 and then through a nozzle 118. The nozzle 118 may include a nozzle aperture 120 to receive the resin 12 from the supply channel 116. The control apparatus 200 may control the substrate stage 102, to move in a direction of arrow 122, and controls the mold chuck 104 and the fluid dispenser 112.

Figure 1B:
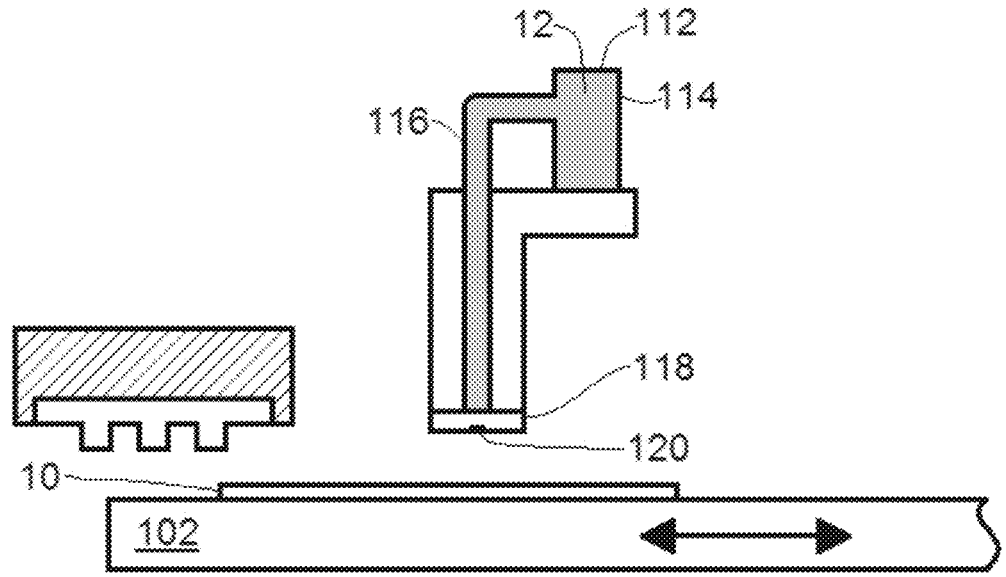
Figure 1C:
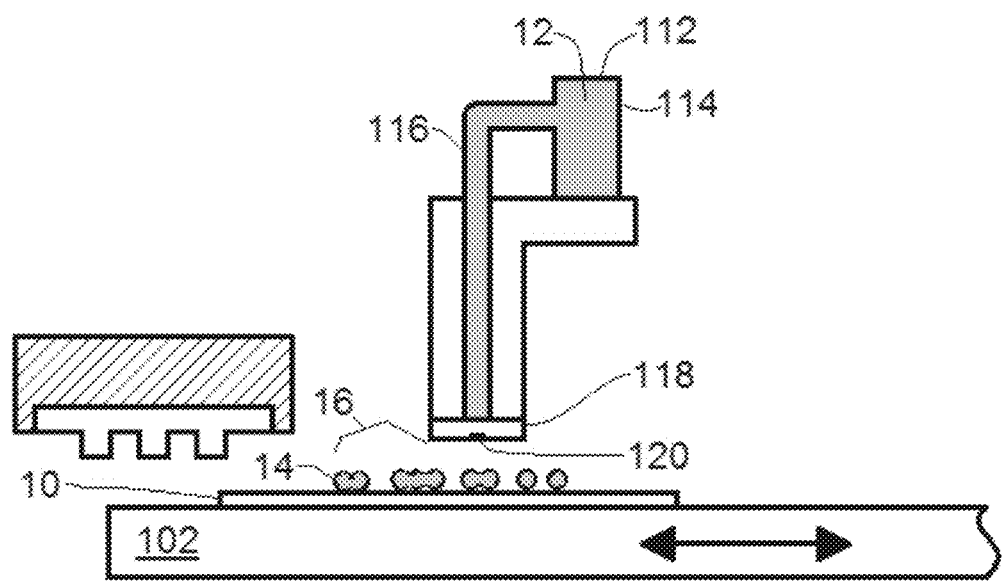

The mold system 100 may operate to place the nano-circuit pattern layer 18 (FIG. 1A) on the substrate 10 as follows. As illustrated in FIG. 1B, the substrate 10 and the fluid dispenser 112 are aligned with each other. As illustrated in FIG. 1C, the fluid dispenser 112 then dispenses resin 12 from the resin tank 114 through the supply channel 116 to the nozzle aperture 120 of the nozzle 118. This deposits individual drops 14 of imprint material (e.g., imprint material 14) onto the substrate 10 in a way that the drops 14 form a drop pattern 16 that follows a predetermined circuit pattern.

Figure 1D:
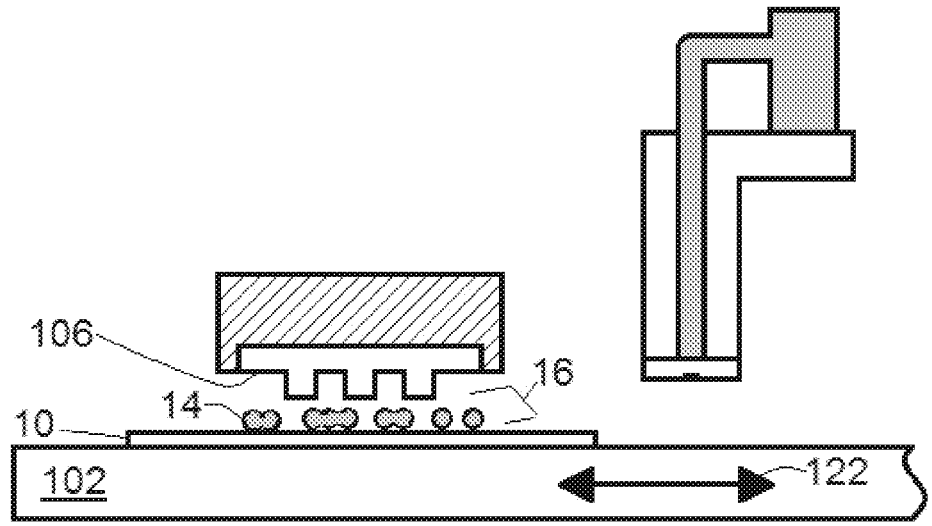
Figure 1E:
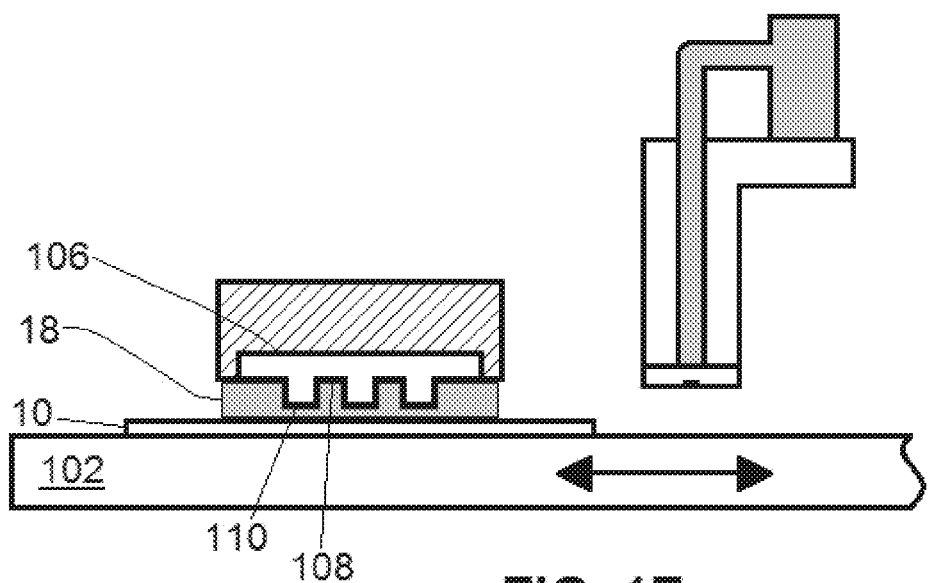

As in FIG. 1D, the substrate stage 102 with the imprint material 14 is moved in a horizontal direction, as shown by arrow 122, from its position illustrated in FIG. 1C to a position (FIG. 1D) aligned with the mold 106. The imprint material 14, arranged into the drop pattern 16, and the mold 106 are brought from the arrangement in FIG. 1D towards being in contact with one another, as in FIG. 1E. While the imprint material 14 is in contact with the mold 106, the imprint material 14 is cured into the nano-circuit pattern layer 18 (see FIG. 1E) that follows cavities 108 and protrusions 110 of the mold 106. After the nano-circuit pattern layer 18 residing on the substrate 10 is cured, the mold 106 and the substrate stage 102 are moved away from each other (see FIG. 1A), leaving behind a product having the nano-circuit pattern layer 18 on the substrate 10.

Figure 2:
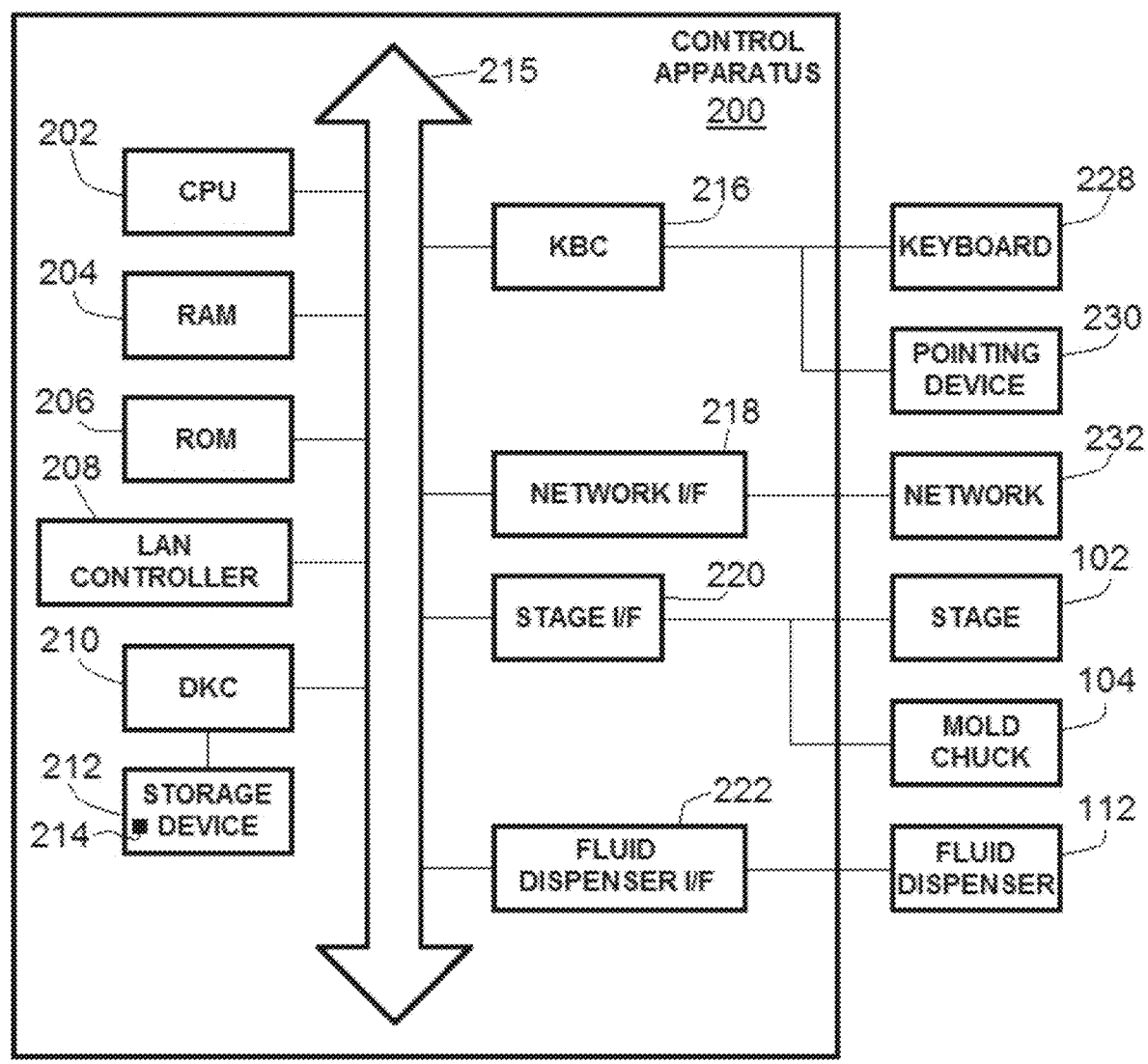
FIG. 2 is a block diagram illustrating a hardware configuration of the control apparatus 200 of FIG. 1A.

FIG. 2 is a block diagram illustrating a hardware configuration of the control apparatus 200 of FIG. 1A. The control apparatus 200 may include a central processing unit (CPU) 202, a random-access memory (RAM) 204, a read-only memory (ROM) 206, a local area network (LAN) controller 208, and a disk controller (DKC) 210, each of which is connected to a bus 215. The CPU 202 controls access to various devices via the bus 215 and the bus 215 may be configured to transfer data between components inside the control apparatus 200. In one example, the control apparatus 200 is a multiprocessor server.

The CPU 202 carries out instructions by performing operations, such as logical, control, and input/output (I/O) operations, indicated by the instructions to control the operation of the control apparatus 200. The RAM 204 may function as the main memory of the CPU 202, a work area, and the like. The ROM 206 may include a nonvolatile memory feature and function as a boot ROM which stores a boot program of the control apparatus 200. The LAN controller 208 may be connected to a network that is local to an area of the control apparatus 200. The CPU 202 can communicate with different local devices via the LAN controller 208.

The disk controller (DKC) 210 controls access to a storage device 212. The storage device 212 may be positioned inside or outside of the control apparatus 200 or be separate from the control apparatus 200. The storage device 212 may be one of a hard disk (HDD), a solid-state drive (SSD), an integrated circuit (IC) card, and the like. The storage device 212 may store, for example, images, programs, data, and various setting information, and may be used to store image processing jobs. In an example, the drop pattern generating application 214 is stored in the storage device 212, loaded into the RAM 204, and then executed by the CPU 202 to cause the control apparatus 200 to perform operations and/or functions. To improve linearity in the low range of resist film thicknesses, the drop pattern generating application 214 may generate aperiodic drop patterns and other drop patterns that do not occur at regular intervals using, for example, a centroidal Voronoi tessellation (CVT) process or directional power CVT (DPCVT) process.

The control apparatus 200 additionally may include a keyboard controller (KBC) 216, a network interface (I/F) 218, a stage I/F 220, and a fluid dispenser I/F 222.

The keyboard controller (KBC) 216 may receive input from a keyboard 228 or a pointing device 230, such as a computer mouse. The keyboard 228 may include software keys or hardware keys which are operated by a user pressing on a key. The network I/F 218 may be connected with a network 232. The network 232 may be in communication with local devices or in communication with remote devices through the Internet. The CPU 202 controls signal input to and output from the network I/F 218. The KBC 216 and the network I/F 218 may receive various setting information as input into the control apparatus 200.

The stage I/F 220 is connected to the substrate stage 102 and the mold chuck 104. The stage I/F 200 may be designed to communicate information between the substrate stage 102 and the control apparatus 200 as well as between the mold chuck 104 and the control apparatus 200. The CPU 202 may cause movement signals to be sent from the stage I/F 220 to the substrate stage 102 (FIG. 1A) or the mold chuck 104 that respectively cause the substrate stage 102 and/or the mold chuck 104 to move.

The fluid dispenser I/F 222 is connected to the fluid dispenser 112 (FIG. 1A). The CPU 202 may cause activation signals to be sent from the fluid dispenser I/F 222 to the fluid dispenser 112. By controlling the timing and values of the activation signals, the CPU 202 can vary the volume of fluid 14 expelled from the nozzle aperture 120 of the fluid dispenser 112.

Figure 3:
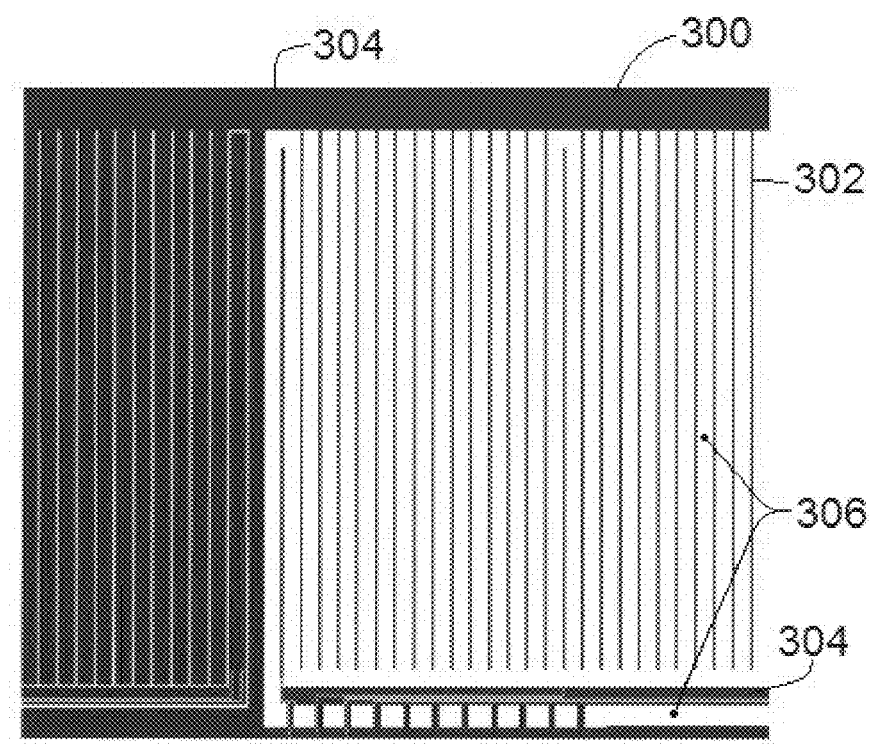
FIG. 3 illustrates an example pattern substrate 300 having a pattern layer 302.

As noted above, the substrate 10 may have a pattern etched into it that includes a set of lines, rectangles, ovals, and other geometry figures that may be used in the specific lithography step. FIG. 3 illustrates an example pattern substrate 300 having a pattern layer 302. In FIG. 3, black color 304 represents features have full height and white color 306 corresponds to depressions 306 etched into the pattern substrate 300. These depressions 306 may vary in height (depth). In other words, the black color 304 corresponds to areas 304 on the pattern substrate 300 that were not etched and the tops of the features identified by the black color 304 correspond to the topography level of the original not-etched substrate 300. A template that is featureless (blank) may be used to imprint resist on the pattern layer 302 of the etched pattern substrate 300. Alternatively, the template itself might likewise have pattern features. The resist may be deposited on the pattern layer 302 based on a drop resist pattern generated by the drop pattern generating application 214 for such a purpose.

Figure 4:
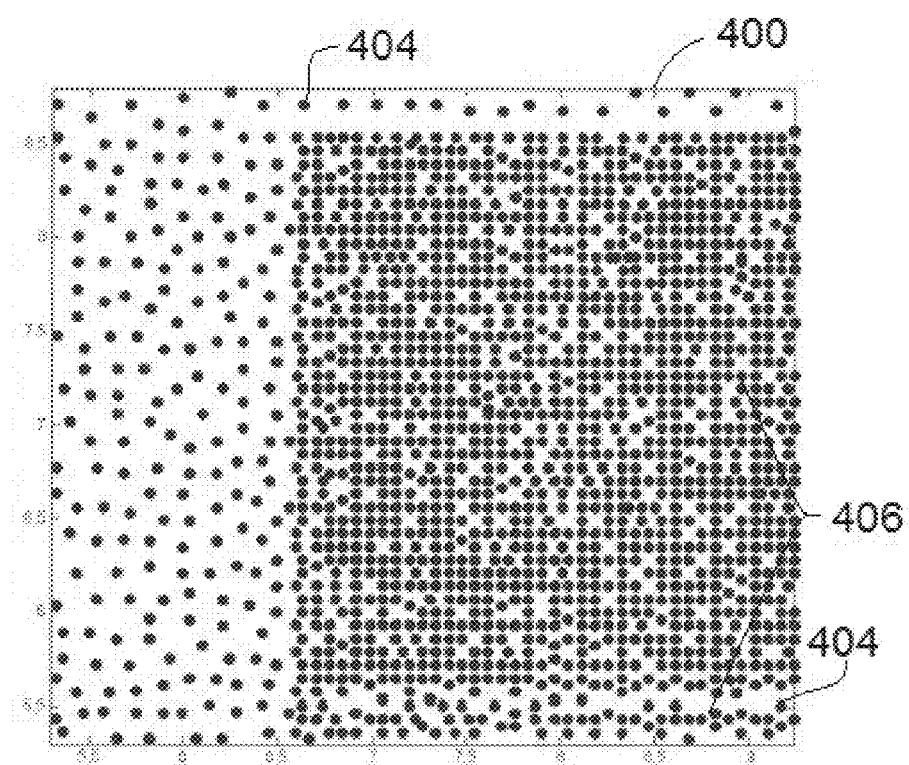
FIG. 4 illustrates a non-rectangular drop pattern 400.

FIG. 4 illustrates a non-rectangular drop pattern 400. The drop pattern 400 may be a non-rectangular pattern for drops 14 generated for the substrate 300 having an etch pattern as illustrated in FIG. 3. The control apparatus 200 may include the drop pattern generating application 214 (FIG. 1A) that, when executed by the control apparatus 200, determines and generates the drop pattern 400. Applying the drop pattern 400 results in resist on the pattern substrate 300 having a thickness that varies with the geometries of the etched substrate 300.

The drop pattern generating application 214 seeks to maximize uniformity of residual layer thickness and optimize the imprint process. That is to say, the drop pattern generating application 214 works towards maintaining a linear relationship between a requested resist thickness and actual thickness of resist measured on the substrate. In one example, the combination of the control apparatus 200 and the drop pattern generating application 214 generates, from a Graphic Data System (GDS) pattern, drop patterns of resist that conform to imprint template features.

As disclosed in U.S. Pat. No. 8,586,126, the volume of the resist drops and number of drops may be matched according to the required local volume to uniformly fill the features and obtain uniform residual layer thickness. In other words, the density of the drop pattern 400 is to be proportional to the local volume to be filled in given fixed drop volume for the whole fluid dispenser.

Depressions 306 that are wide depressions (white color 306 illustrated on the right side of FIG. 3) require more local resist volume to be filled in than those white color depressions 306 that are narrow and illustrated in the blacker color region on the left side of FIG. 3. In other words, the number of drops per unit area needed to fill in the left side of the pattern substrate 300 is less than the number of drops per unit area needed to fill in the right side of the pattern substrate 300. FIG. 4 illustrates this via a sparse drop area 404 and a dense drop area 406 having more drops per unit area in the non-rectangular drop pattern 400 than the sparse drop area 404.

The drop pattern generating application 214 calculates the local resist volume for all features on the substrate 300. The present example is a case where only one side of the substrate 300 has features. In other examples, the drop pattern generating application 214 calculates local resist volume for all features included on both sides a substrate and a mold used with the substrate or the mold when only the mold has features.

Figure 5A:
FIG. 5A illustrates the substrate 10 having the drop pattern 16, which includes the drops 14.
Figure 5B:
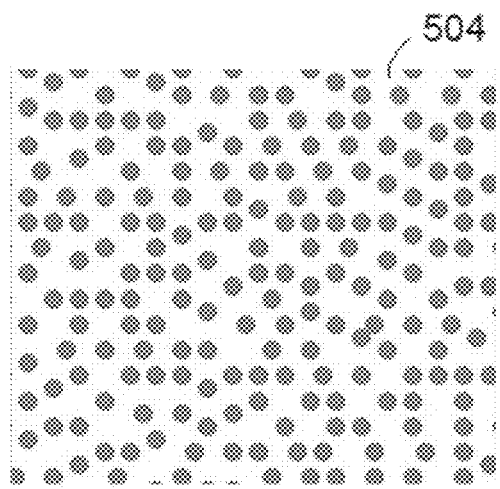
FIG. 5B illustrates a top-down view of a drop pattern 504 with targeted resist thickness of 90 nm.
Figure 5C:
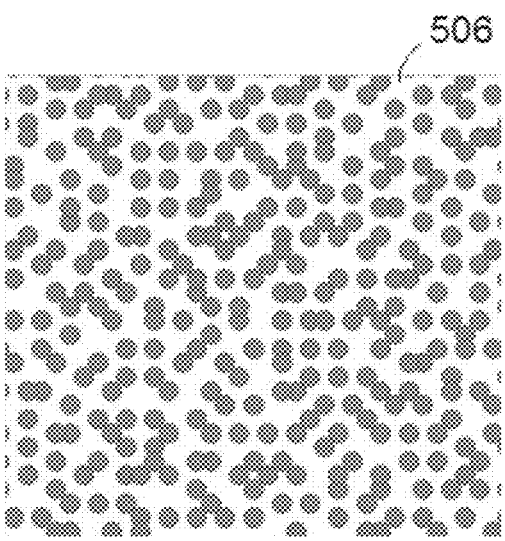
FIG. 5C illustrates a drop pattern 506 with targeted resist thickness of 150 nm.
Figure 5D:
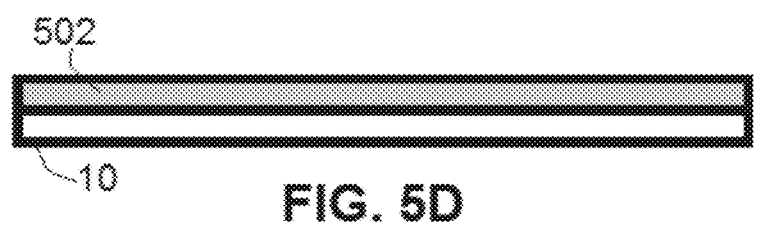
FIG. 5D illustrates the substrate 10 having a resist layer 502 that is uniform in thickness.

To dispense the correct resist volume, the given fluid dispenser (FD) 112 (FIG. 1A) needs to be calibrated. FIG. 5A illustrates the substrate 10 having the drop pattern 16, which includes the drops 14. The drop pattern 16 in FIG. 5A is comparable to the drop pattern 16 in FIG. 1C. FIG. 5B illustrates a top-down view of a drop pattern 504 with targeted resist thickness of 90 nm. FIG. 5C illustrates a drop pattern 506 with targeted resist thickness of 150 nm. Moreover, FIG. 5D illustrates the substrate 10 having a resist layer 502 that is uniform in thickness.

Table I below illustrates example requested resist thicknesses and the measured resist thicknesses, arranged in increasing order of requested resist thickness. Table I also includes a difference between the requested resist thicknesses and the measured resist thicknesses.

TABLE I

| Requested resist thickness | Measured resist thickness | Difference |
|---|---|---|
| 60 nm | 60 nm | 0 nm |
| 133 nm | 112 nm | 21 nm |
| 142 nm | 100 nm | 42 nm |
| 152 nm | 152 nm | 0 nm |
| 500 nm | 353 nm | 147 nm |

As listed in the difference column in Table I, there is a difference between the requested resist thickness and the measured resist thickness. The dependence of measured versus requested film thicknesses is not linear since the resulting measured thickness is less than the requested thickness in some requested thickness ranges.

Figure 6:
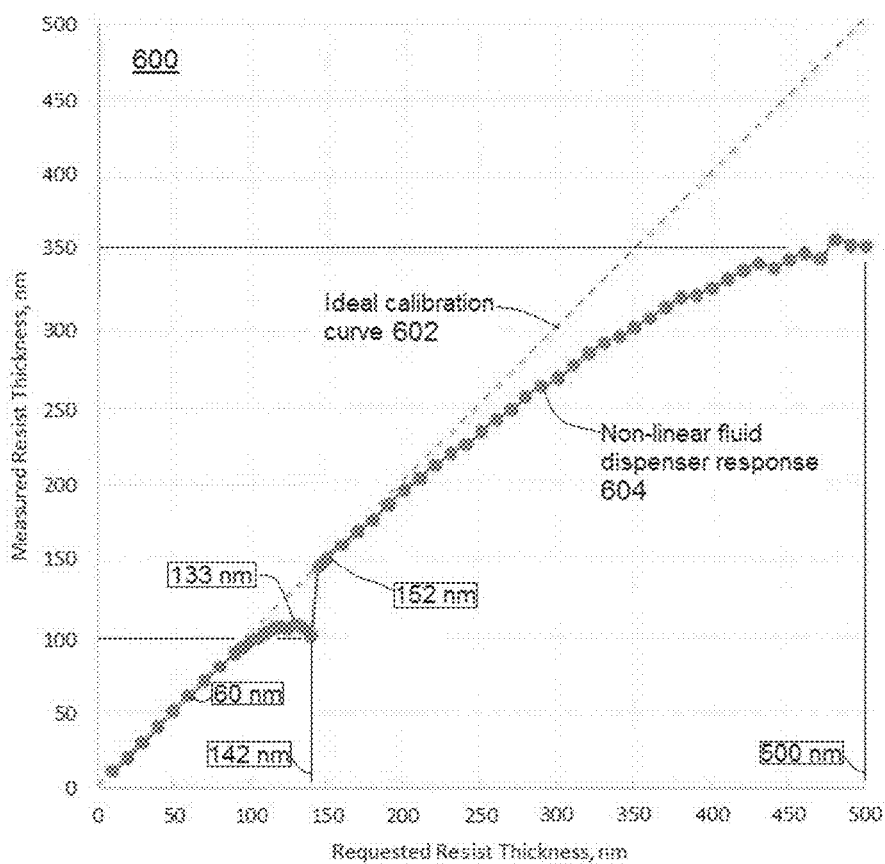
FIG. 6 illustrates a plot 600 having two fluid dispenser calibration curves.

FIG. 6 illustrates a plot 600 having two fluid dispenser calibration curves. The dashed line in FIG. 6 shows an ideal linear calibration curve 602 and the solid line demonstrates a non-linear fluid dispenser response 604. Requested resist thicknesses 60 nm, 133 nm, 142 nm, 152 nm, and 500 nm from Table I are also identified in FIG. 6. The ideal calibration curve 602 is linear with the slope that is equal to 1, and where requested resist thickness coincides with experimentally observed/measured resist thickness after the resist is cured, and the template 106 (FIG. 1A) is separated from the nano-circuit pattern layer 18. The ideal linear calibration curve for a non-rectangular grid pattern is valid for the drop patterns 400 in FIG. 5B or FIG. 5C but does not work for other drop patterns.

The non-linear fluid dispenser response 604 demonstrates real/measured data. In some cases, the amount of dispensed and cured resist cannot be characterized by linear dependence. As illustrated in FIG. 6, the fluid dispenser response is linear at the small thickness range of 0 nm to 80 nm. The fluid dispenser response then becomes non-linear above 80 nm. For example, in the range of 80 nm to 145 nm, and above 160 nm, a fluid dispenser dispenses less than requested resist volume, which may decrease device performance and semiconductor chip yield.

Within the range of 0 nm to 160 nm requested resist thickness, FIG. 6 illustrates that the calibration curve 604 is linear in the range of 0 nm to 80 nm. At thicknesses larger than 80 nm, conventional fluid dispenser behavior is non-linear, except the range of approximately 145 nm to 160 nm. The non-linearity comes from the fact that the drop volume of the dispensed drop depends on the pattern density. In other words, the drop volume depends on distance between firing nozzles.

Figure 7:
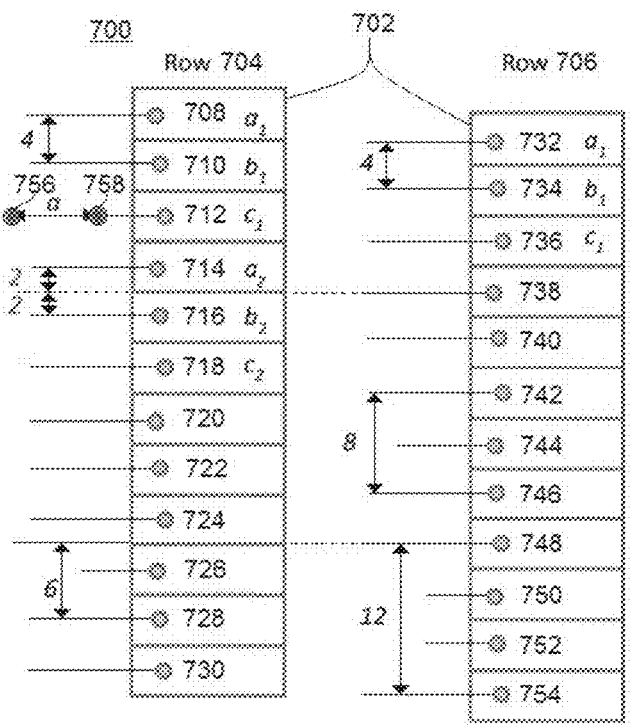
FIG. 7 is a bottom view schematic of a fluid dispenser layout 700.

FIG. 7 is a bottom view schematic of a fluid dispenser layout 700. The fluid dispenser layout 700 includes rows of nozzles 702, including a first nozzle row 704 and a second nozzle row 706 represented by two vertical columns having offset alignment with each other. The first nozzle row 704 includes nozzles 708-730 and the second nozzle row 706 includes nozzles 732-754.

FIG. 7 illustrates distance between firing nozzles, including vertical distances between the two adjacent fluid dispensing nozzles. The vertical distance between two adjacent nozzles is measured in units of minimal distance achievable by two pass dispensing, forward and backward (right to left then left to right, or vice versa) with an offset. The vertical distance between closest nozzles 708 and 710 in first nozzle row 704 is equal to 4 units. In a case where the first nozzle row 704 and the second nozzle row 706 dispense drops by each available nozzle 708-754 while the substrate 10 moves in a single pass in one direction, such as right to left, the distance between the drops in vertical direction is 2 units. For example, the vertical distance between the nozzle 738 and the nozzle 714 is 2 units.

That the drop volume depends on distance between firing nozzles can be explained by nozzle cross-talk as any fluid dispenser is mostly mechanical system with all its vibrations, natural frequencies. For example, if a user request resist film thickness of 140 nm, a conventional fluid dispenser would deliver, for example, only a 101 nm thick film. The 39 nm thickness mismatch between requested and delivered resist thickness is not desirable in nanoimprint lithography. Experiments traced this issue to the firing of multiple nozzles where the firing substantially is simultaneous and the nozzles are in proximity to each other.

During operations of a fluid dispenser having multiple nozzles, it is common that neighboring nozzles are fired simultaneously or close in time to one another. Fluid dispensers, such as multiple fluid dispensers 112 or those illustrated in FIG. 7, demonstrate mechanical resonances when the fluid dispenser nozzles are activated in the proximity of each other as follows.

Each nozzle 118 (FIG. 1A) (or the nozzles 708-730 in the first nozzle row 704, or the nozzles 732-754 in the second nozzle row 706 (FIG. 7)) typically are in physical communication with other nozzles through the common piezo walls. The walls in one nozzle 118 are shared with neighboring nozzles and affect nozzle firing operations in those neighboring nozzles. The firing of each nozzle 118 excites fluid mechanics within the nozzle 118. Likewise, a nozzle 118 is affected by excitation of the neighboring nozzles.

When arranged in nozzle rows, such as the first nozzle row 704 or the second nozzle row 706, the firing of each nozzle generates and propagates a long range acoustical wave through flexible walls of each nozzle. This crosstalk influencing phenomenon between neighboring fluid firing chambers and nozzles conventionally results in varying drop volume of the dispensed drops 14 (FIG. 1C) from multiple simultaneously actuated nozzles of a fluid dispenser. For instance, the thickness minimum observed on FIG. 6 at 142 nm has the shortest inter-nozzle distance of 4 units, which is the shortest distance between two neighbor nozzles in one row, such as the nozzles 708 and 710 in FIG. 7.

In normal operation, a substrate 10 under the fluid dispenser layout 700 moves perpendicular to the rows of nozzles 702, for example from right to left in FIG. 7. FIG. 7 also illustrates a first resist drop 756 and a second resist drop 758, each dispensed in order from the nozzle 712.

After the first pass and in the beginning of the next motion, if the motion direction of the substrate 10 is changed to a second pass on opposite with one single vertical offset 1 unit, then the vertical distance between the drops reduces to 1 unit. Here, the two passes can be used to define the value of 1 unit. Typically, one unit is ~35 microns (μm) but in other types of fluid dispensers, one unit may be 40 microns or some other unit value. As more passes and more pass offsets are applied, the vertical distance between the drops can be reduced to less than 1 unit. The present examples use two passes to define the value of 1 unit.

Returning to FIG. 6, the 100 nm minimum observed at a requested resist thickness of 142 nm occurs when all the closest fluid dispenser nozzles in row 704 and row 706 (FIG. 7) are firing at the same or near the same time, correspondingly. The 100 nm minimum is a result of a conventional drop pattern generating application with a fluid dispenser having a non-linear response in a range encompassing the requested thickness for the given drop pattern.

The change from a non-rectangular pattern to a rectangular pattern may be area by area within a drop pattern. For example, as the requested resist thickness increases from 80 nm towards 142 nm, more and more areas of the drop pattern will show ordered arrangements similar to a 2×2 (units)^2 grid. For example, the dense drop area 406 of the drop pattern 400 in FIG. 4 has drops that are more close to each other and are arranged in a near rectangular pattern. The requested resist thickness for these drops may be in the range 80 nm to 142 nm. By comparison, the sparse drop area 404 demonstrates drops that are further apart from each other and are arranged more randomly in a non-rectangular pattern. The requested resist thickness for the drops in the sparse drop area 404 may be in the range of 0 nm to 80 nm.

In a case where a drop pattern generating application outputs a 2×2 unit-grid pattern, adjacent nozzles 708 and 710 of FIG. 7 fire practically at the same time. Since the nozzles 708 and 710 are horizontally offset in the x direction from each other according to fluid dispenser design, a slight mismatch between firing times can be observed such that the nozzles 708 and 710 do not fire at the same time. In any event, the mechanical resonances resulting from these two adjacent nozzles firing at the same time or at nearly the same time affect the nozzle dispensed fluid volume from both the nozzle 708 and the nozzle 710.

Similar to the nozzle 708 and the nozzle 710, the nozzle 710 and the nozzle 712 are horizontally offset in the x direction from each other at a horizontal offset distance that is the same as the horizontal offset distance between the nozzle 708 and the nozzle 710. The offset pattern repeats so that there are horizontal offsets between the nozzles 714, 716, and 718, the nozzles 720, 722, and 724, etc. In this regard, the nozzles in each of the rows of nozzles 702 can be grouped according to the horizontal offset pattern. The nozzles 708, 710, and 712 may be designated as row 704, group 1 (a1, b1, c1), and the nozzles 714, 716, and 719 may be designated row 704, group 2 (a2, b2, c2). Each "a" nozzle in each group is vertically aligned, i.e. nozzles a1, a2, . . . , $a_n$ in row 704 do not have any offset. Similarly, nozzles b1, b2, . . . , $b_n$ in row 704, the "b" nozzles, do not have any offset. They are vertically aligned, where "n" is a nozzle number. Based on these offset groupings, it follows that one pass rectangular drop patterns like 4×2, 4×4, . . . , 4×M grids have minima in the dispensed resist volume. To lessen minima in the dispensed resist volume from rectangular drop patterns, the drop pattern generating application 214 may be revised to further process drop patterns using a predetermined repeating pattern or using randomization. By making positions of drops remote from one another or in a random drop pattern (when making non-rectangular drop patterns), firing closest nozzles can be a rare event.

When the closest nozzles fire, there is a significant decrease in drop volume. For example, there may be a significant decrease in drop volume in a×2 grids, where a is grid period in X-direction, every nozzle in both rows fires in one pass only, in a×1 grids, which are the same as a×2 grid but in forward and reverse passes combined, and in a×4 grids where each nozzle fires only in one row. These may be addressed by dividing all the patterns into sub-patterns in such a way that eliminates drops that are spaced 1 unit and 2 units in the vertical direction and by dispensing each pattern separately.

Nozzle 708 and nozzle 732 in FIG. 7 can dispense a×2 grid in one pass. For example, the dispensing can be one forward pass. The same nozzles 708 and 732 can dispense a×1 grid in two passes. For example, the dispensing can be one forward and one reverse pass. Other scheme of passes can be applied. The total number of dispensed drop rows that the nozzles 708 and 732 can dispense in two passes is 4. Thus, any pattern can be divided into sub-patterns where minimum sub-divisions are each spaced over the nearest 4 drop rows.

Figure 8:
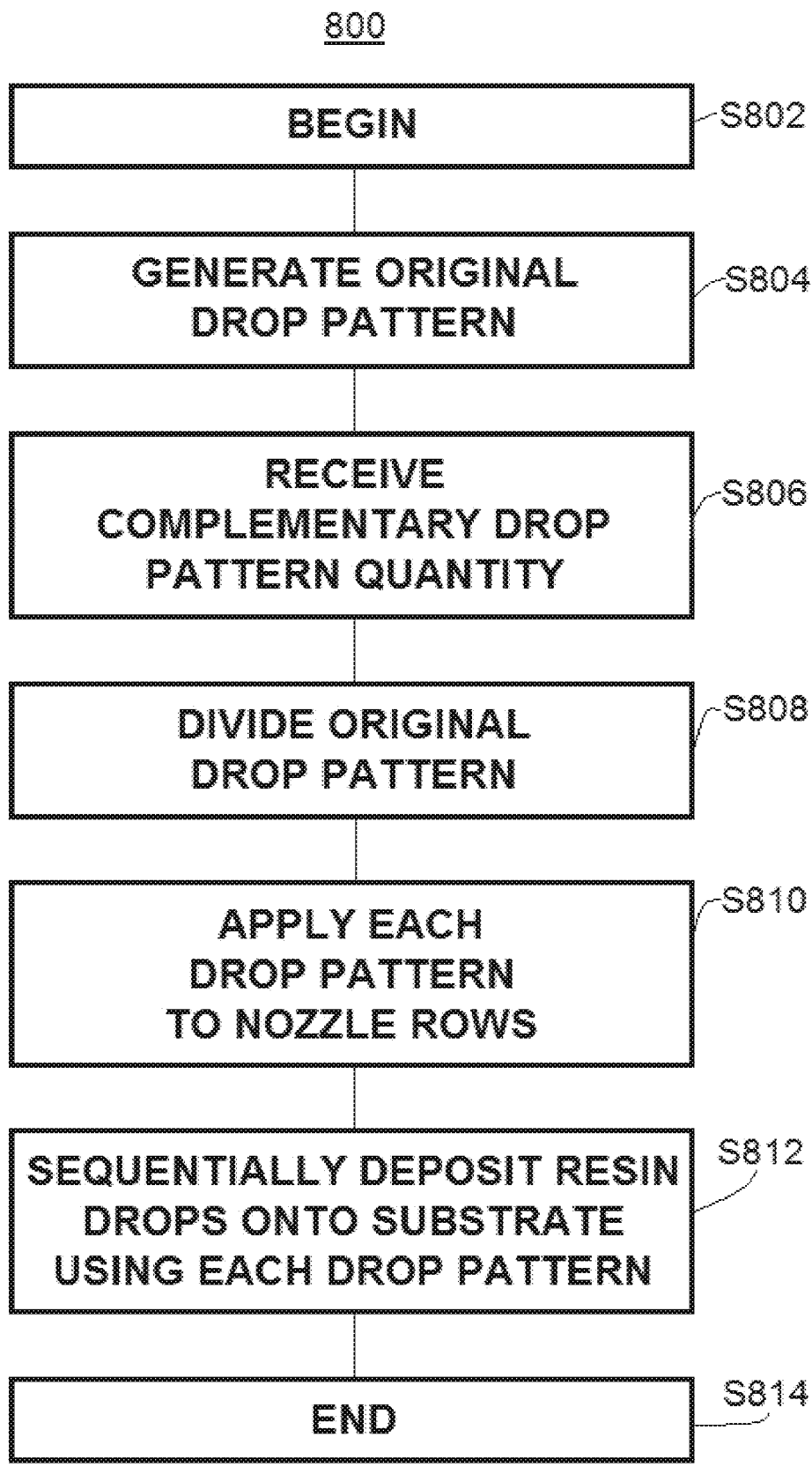
FIG. 8 is a method 800 to make fluid dispenser response more linear.

FIG. 8 is a method 800 to make fluid dispenser response more linear. Method 800 operates to periodically revise a drop pattern that controls fluid dispensers into drop sub-patterns that increase the distance between simultaneously fired nozzles in the same row. Increasing the distance between simultaneously fired nozzles reduces or eliminates fluid dispenser mechanical resonances. As a result, output from a fluid dispenser results in a more accurate resist layer thicknesses, thereby increasing device performance and semiconductor chip yield.

Figure 9A:
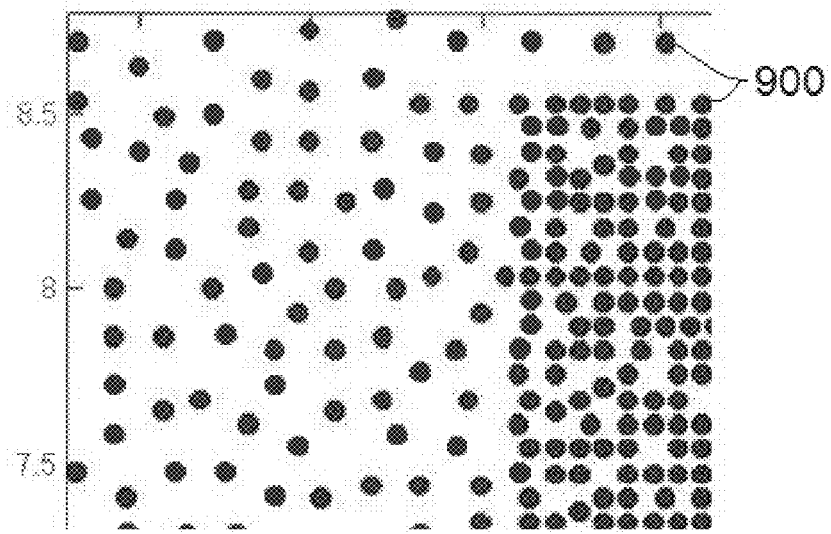
FIG. 9A illustrates a portion of an original drop pattern 900.

The method 800 begins at step S802. At step S804, the control apparatus 200 executes the drop pattern generating application 214 to generate and output an original drop pattern. FIG. 9A illustrates a portion of an original drop pattern 900. The original drop pattern 900, generated and output by the drop pattern generating application 214, is displayed as filled circles 900 and is based on the upper left corner portion of the non-rectangular drop pattern 400 of FIG. 4. The original drop pattern 900 then may be periodically divided into two, three or more complementary drop patterns as a way to reduce or eliminate fluid dispenser mechanical resonance.

At step S806, the control apparatus 200 receives input designating the number (N) of complementary drop patterns as a complementary drop pattern quantity by which the original drop pattern is to be divided. The original drop pattern 900 can be subdivided into N drop sub-patterns, where N=2, 3, 4, . . . or higher. In the present example, the control apparatus 200 receives "2" at step S806 from user input as the number of complementary drop patterns.

Figure 9B:
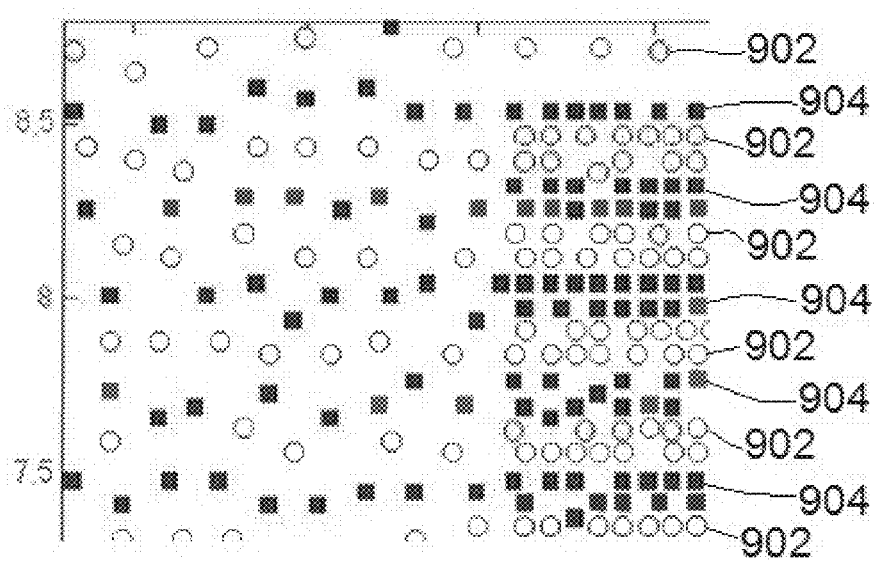
FIG. 9B illustrates a second drop pattern 902 and a third drop pattern 904.

FIG. 9B illustrates a second drop pattern 902 and a third drop pattern 904. At step S808, the drop pattern generating application 214 may divide the original non-rectangular drop pattern 900. The resulting quantity of sub-patterns is based on the number of complementary drop patterns received in step S806. In this example where "2" was received at step S806, the drop pattern generating application 214 divides the original drop pattern 900 into two complementary drop patterns: the second drop pattern 902 and the third drop pattern 904.

In FIG. 9B, the second drop pattern 902 is displayed as open circles 902 located in equally spaced and separated vertically drop bands. Each drop band is 4 units wide in the vertical direction. The third drop pattern 904 is displayed as filled squares 904. The third pattern also is divided in separate equally spaced 4 units wide drop bands. The second drop pattern 902 and the third drop pattern 904 are sub-patterns of the original drop pattern 900.

To perform step S808, the control apparatus 200, executing the drop pattern generating application 214, may divide the original drop pattern 900 in such a way that, when the second drop pattern 902 is applied to the first nozzle row 704 (FIG. 7), the nozzles a1, c1, b2, . . . (nozzles 708, 712, 716 . . . ) are fired while the third drop pattern 904 with the nozzles b1, a2, c2, . . . (nozzles 710, 714, and 718 . . . ) are not fired. When the third drop pattern 904 is applied to the first nozzle row 704, the nozzles b1, a2, c2, . . . (nozzles 710, 714, and 718 . . . ) are fired while the second drop pattern 902 with the nozzles a1, c1, b2, . . . are not fired.

In general, the drop pattern generating application 214 may divide the original drop pattern 900 so that the nozzles a(n), c(n), b(n+1), a(n+2) are fired but the nozzles b(n), a(n+1), c(n+1) are not. In this 2 sub-patterns example, the closest nozzles will be 8 units of distance away from each other. Alternatively, to fire each a(n), a(n+1), a(n+2), . . . nozzle, the original drop pattern may be subdivided in 3 sub-patterns. Each sub-pattern consists of separate drop bands, each 4 units wide (in the vertical direction).

In addition, the drop pattern generating application 214 is configured to divide the original drop pattern 900 in such a way that an average requested resist film thickness of each sub-pattern is in a linear thickness range as illustrated in FIG. 6. For example, the drop pattern generating application 214 is configured to generate the second drop pattern 902 from the original drop pattern 900 so that the average requested resist film thickness for the second drop pattern 902 in a linear low thickness range, for instance, in the range of 0 nm to 80 nm, is in a linear thickness range as illustrated in FIG. 6.

The non-rectangular pattern of FIG. 9A can be subdivided into two, three or more drop sub-patterns. If the original pattern 900 is subdivided in three sub-patterns, where each sub-pattern consists of equally spaced 4 units wide individual drop bands, the nozzles a(n), a(n+1), a(n+2) and so on may fire simultaneously, but the nozzles b(n), c(n), b(n+1), c(n+1), and so on are not fired. In this 3 sub-pattern example, the closest nozzles will be 12 units of distance away from each other.

Figure 10A:
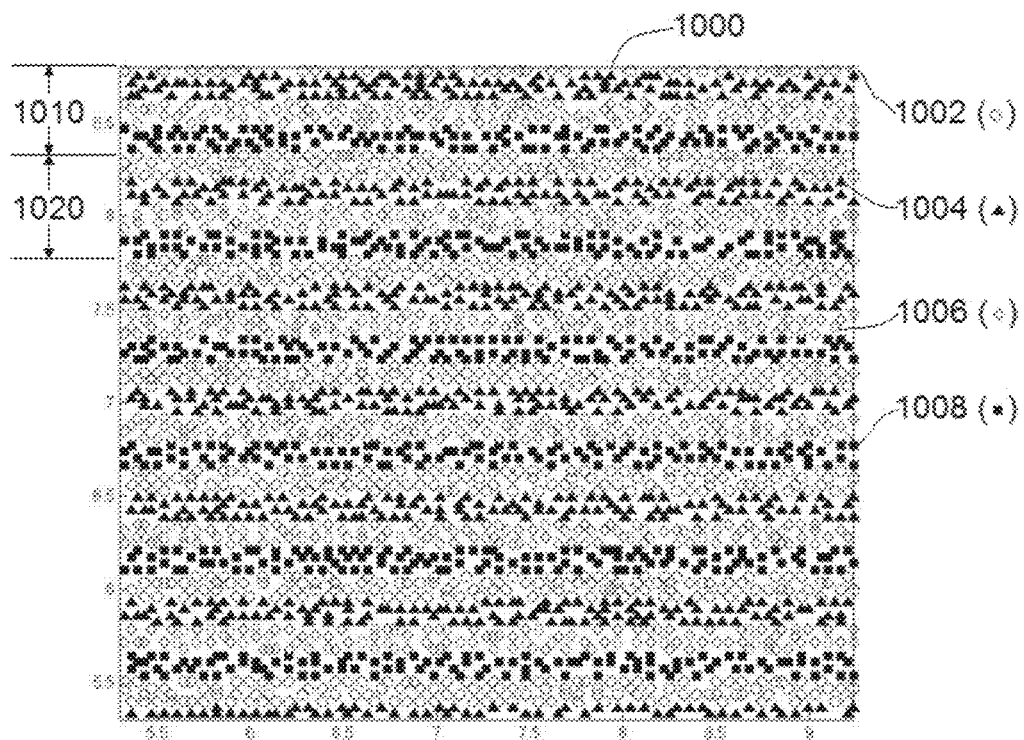
FIG. 10A illustrates groups of four sequential drop pattern lines.

FIG. 10A illustrates groups of four sequential drop pattern lines. The first drop pattern 1002 is displayed as open circles 1002, located in equally spaced and separated vertically drop bands. The second drop pattern 1004 is displayed as filled triangles 1004. The third drop pattern 1006 is displayed as filled open diamonds 1006. The fourth drop pattern 1008 is displayed as filled squares 1008.

The non-rectangular pattern can be further subdivided into more drop sub-patterns. For example, for 4 sub-patterns, a first group of four sequential drop pattern lines 1010 spaced by one vertical unit is assigned to a first sub-pattern, FIG. 10A. The next group of four sequential drop pattern lines 1020 spaced by one vertical unit is assigned to a second sub-pattern, FIG. 10A. In doing so, the drop pattern generating application 214 makes sure that not every nozzle but every fifth nozzle is fired simultaneously. In other words, a(n) and b(n+1) are firing simultaneously if needed.

Regarding the example of divided the original drop pattern 900 into 4 sub-patterns, nozzles a(n), b(n+1), c(n+2), a(n+3), . . . , or every fifth nozzle (every fourth nozzle after the first one) can be excited simultaneously. In this 4 sub-pattern example, the closest nozzles will be 16 units of distance away from each other. Again, each sub-pattern should result in an average resist film thickness in the linear fluid dispenser regime, which means small thickness. For example, each sub-pattern should provide a film thickness (if imprinted separately) in the range of 0 nm to 80 nm.

Figure 10B:
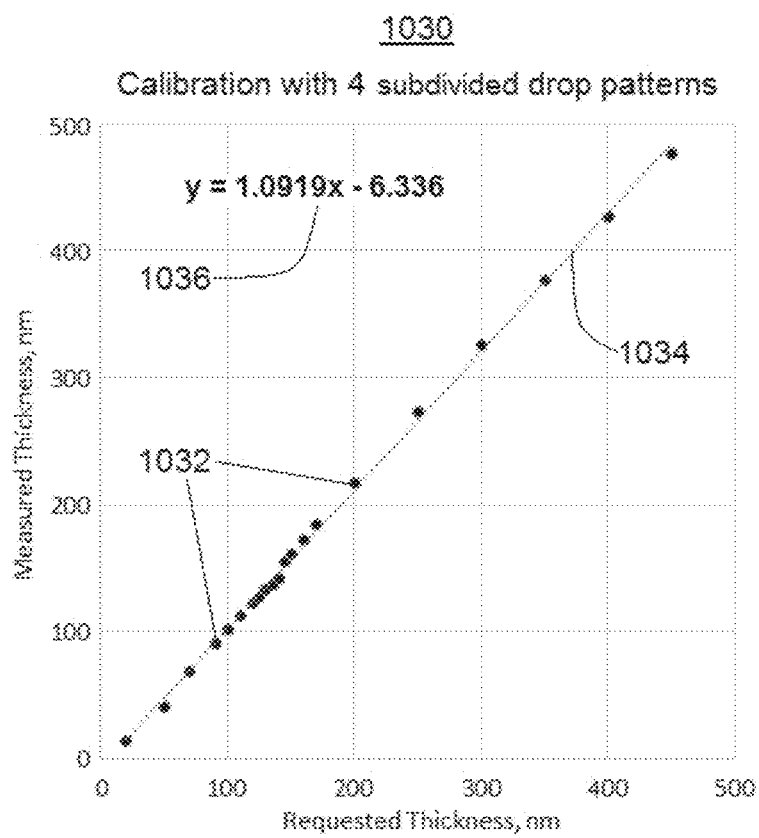
FIG. 10B is a graph 1030 of a calibration result when using 4 drop sub-patterns such as those in FIG. 10A.

FIG. 10B is a graph 1030 of a calibration result when using 4 drop sub-patterns such as those in FIG. 10A. The x-axis in the graph 1030 represents a requested resist thickness in nanometers (nm) and the y-axis represents a measured resin thickness in nanometers. The graph 1030 includes data points 1032, a fitting line 1034, and its equation 1036. The data points 1032 represent experimental data based on requested resin thickness and measured resin thickness. The fitting line 1034 is a line calculated to fit the data points 1032 as best possible. The slope-intercept equation 1036, y=1.0919x−6.336, is the formula for the fitting line 1034.

As illustrated in FIG. 10B, the calibration with subdivided pattern 1000 shows a linear trend. This means that drop volume does not change as more nozzles are fired. Pattern subdivision and sequential sub-pattern dispense in this example leads to linear fluid dispenser response, making the pattern 1000 usable in nanoimprint lithography.

The slope in the slope-intercept equation 1036 is 1.091. Here, the scale of the x-axis requested resist thickness can be modified to obtain an ideal slope of 1 in the slope-intercept equation 1036 by using simple linear mathematical transformation. In other words, the horizontal scale can be correspondingly adjusted (re-scaled) so the slope of the fitting line 1034 will be 1 with the same data points 1032. In this example, the original scale of the x-axis requested resist thickness was maintained as a purpose of the experiment illustrated in the graph 1030 was to obtain linear dependence.

Returning to FIG. 8, method 800 proceeds from step S808 to step S810. At step S810, each drop sub-pattern may be applied to both nozzle rows. In an example, nozzles 708 and 732 (FIG. 7) dispense drop bands that are 4 units tall (strip width) having 4 sequential lines of drops spaced 1 unit apart such that both nozzle rows 704 and 706 are used. In this example, the second drop pattern 902 (FIG. 9B) and the third drop pattern 904 are sequentially applied to both, the first nozzle row 704 and the second nozzle row 706. At step S812, both nozzle rows 704 and 706 deposit resin drops onto a substrate to form in a sequential manner each drop sub-pattern.

When combined by sequential dispensing, the sub-patterns form the original drop pattern 1000 on the substrate. In other words, each sub-pattern is dispensed separately and sequentially, where the resulted dispensed drop pattern will be the original drop pattern 1000. That is to say, rather than dispense the whole pattern momentarily, the plurality of dispense patterns are dispensed individually and at different times such that the original whole pattern is physically recreated then on the substrate and not in the software memory. In the example, the first nozzle row 704 and the second nozzle row 706 (nozzles 118 in FIG. 1C) sequentially deposit resin drops 14 onto the substrate 10 according to each drop sub-pattern to create a product having the nano-circuit pattern layer 18 on the substrate 10. From step S812, the method 800 proceeds to step S814, where the method 800 ends.

Method 800 is beneficial in that the distance between firing nozzles is increased. This increased distance reduces or eliminates fluid dispenser mechanical resonance that, in turn, increases device performance and semiconductor chip yield by increasing uniformity of dispensed drop volumes, and uniformity of residual layer thicknesses.

Figure 11:
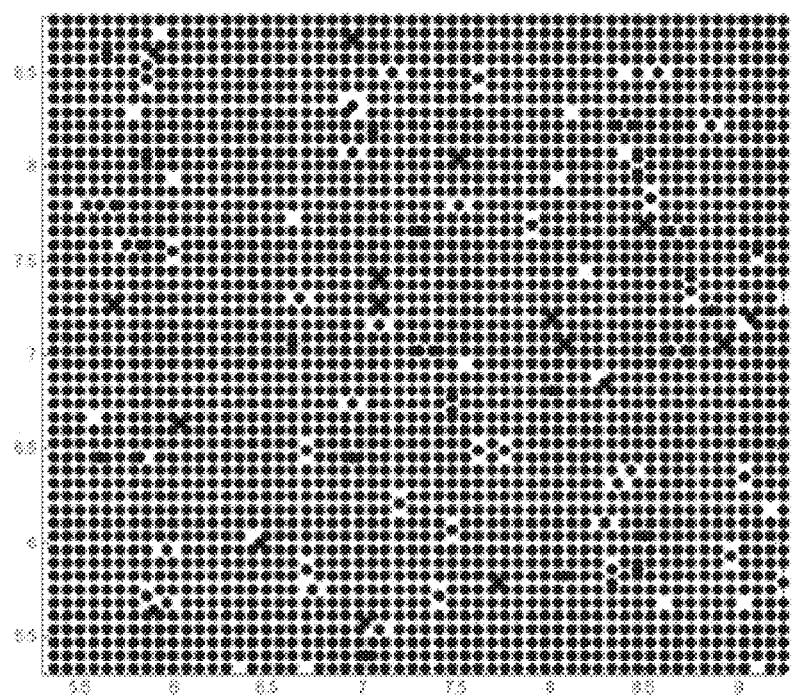
FIG. 11 illustrates a substantially rectangular drop pattern 1100.

FIG. 11 illustrates a substantially rectangular drop pattern 1100. The drop pattern 1100 may be a rectangular pattern for drops 14 (FIG. 1C) generated by a drop pattern generating application based on a requested resist thickness of 140 nm (see FIG. 6). Most of the drop pattern 1100 is close to a rectangular 2×2 (unit)^2 grid drop pattern.

Figure 12:
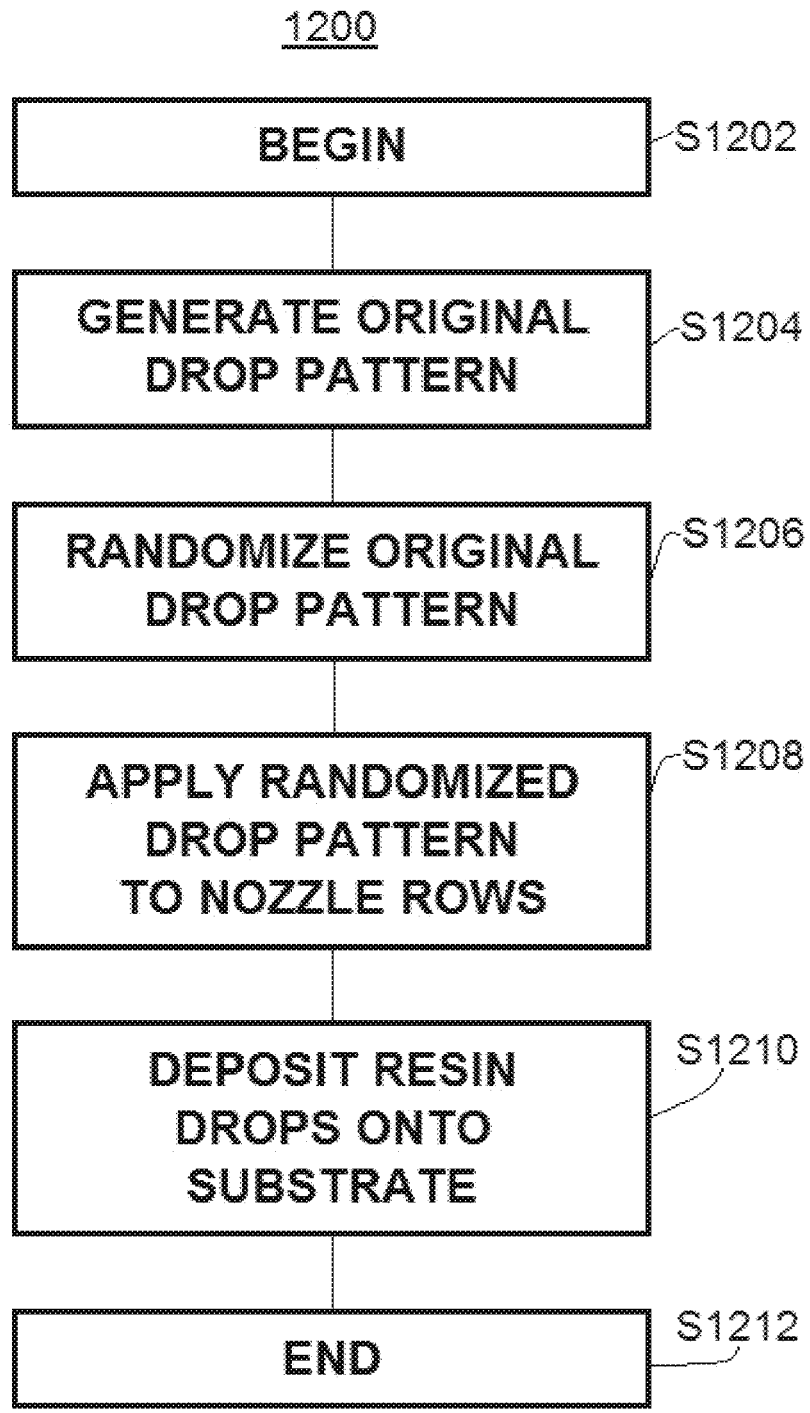
FIG. 12 is a method 1200 to make fluid dispenser response more linear.

FIG. 12 is a method 1200 to make fluid dispenser response more linear. Method 1200 operates to randomly revise a drop pattern that controls fluid dispensers into drop pattern that increase the distance between simultaneously fired nozzles in the same row. The method 1200 begins at step S1202.

Figure 13A:
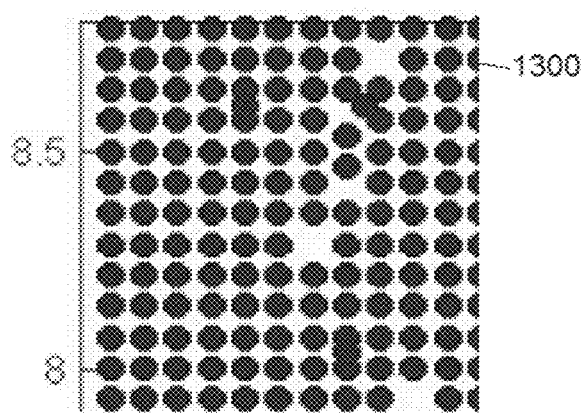
FIG. 13A illustrates an original drop pattern 1300.

At step S1204, the control apparatus 200 executes the drop pattern generating application 214 to generate and output an original drop pattern. FIG. 13A illustrates an original drop pattern 1300. The original drop pattern 1300, generated and output by the drop pattern generating application 214, is displayed as filled circles 1300 and is based on the upper left corner portion of the rectangular drop pattern 1100 of FIG. 11. The original drop pattern 1300 then may be randomly reorganized into a new drop pattern to reduce or eliminate fluid dispenser mechanical resonance. In an example, the control apparatus 200 utilizes MATLAB (trademark), C, C++, Pascal, Fortran, Basic, GNU Octave, or other programming software random function to randomly modify the original drop pattern 1300.

Figure 13B:
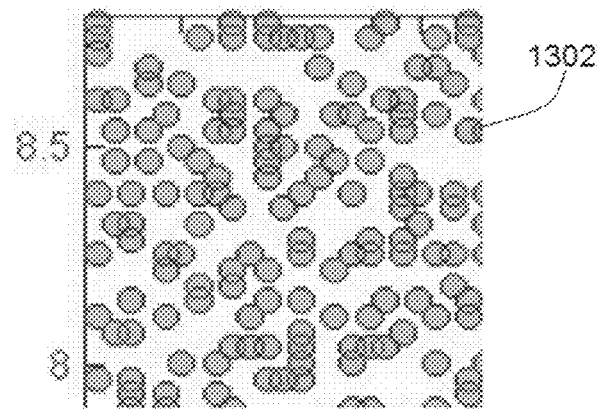
FIG. 13B illustrates a second drop pattern 1302.

At step S1206, the drop pattern generating application 214 randomizes the original rectangular drop pattern 1300 (FIG. 13A) into a second drop pattern. FIG. 13B illustrates a second drop pattern 1302. The drop pattern generating application 214 randomizes the original rectangular drop pattern 1300 into the second drop pattern 1302.

In an example of the randomization at step S1206, each drop in the original rectangular drop pattern 1300 is arbitrarily (1) moved or displaced by +1 unit or −1 unit in a vertical, diagonal, or horizontal direction from its position in the original rectangular drop pattern 1300, or (2) held in place in the original position of the drop. The randomization can result in the drop being located in one of nine positions within a 3×3 grid. If the drop pattern generating application 214 moves two or more drops to the same position, the first moved drop is kept on its new place while the other drops cannot be moved to the same position. They have less possible positions to move to randomly.

The method 1200 proceeds from step S1206 to step S1208. At step S1208, the second drop pattern 1302 is applied to each nozzle row, for example nozzle rows 704 and 706. At step S1210, the nozzle rows deposit resin drops onto a substrate to create a product. Here, both nozzle row 704 and 706 (nozzles 118 in FIG. 1C) deposit resin drops 14 onto the substrate 10 according to the second drop pattern 1302 to create a product having the nano-circuit pattern layer 18 on the substrate 10. From step S1210, the method 1200 proceeds to step S1212, where the method 1200 ends.

Figure 14:
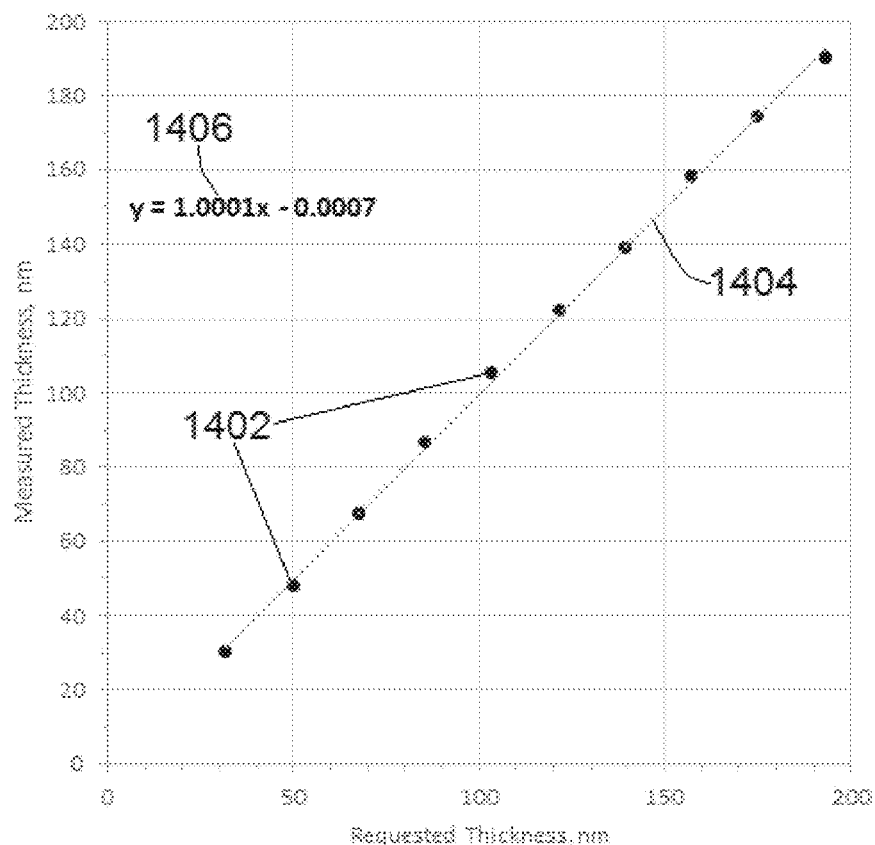
FIG. 14 is a calibration graph 1400 of a result of randomization of the first drop pattern 1300 at each chosen thickness into corresponding second drop pattern 1302.

FIG. 14 is a calibration graph 1400 of a result of randomization of the first drop pattern 1300 at each chosen thickness into corresponding second drop pattern 1302. The x-axis in the calibration graph 1400 represents a requested resist thickness in nanometers (nm) and the y-axis represents a measured resin thickness in nanometers. To begin, the requested resist thickness is obtained and used to generate and output the original drop pattern 1300 at step S1204 in FIG. 12. The method 1200 modifies the original drop pattern 1300 to create the second drop pattern 1302. The second drop pattern 1302 then is applied to the nozzles 118 in FIG. 1C and the control apparatus 200 causes the nozzles in row 704 and/or row 706 in FIG. 7 to discharge resin drops according to second drop pattern 1302 to create resin thicknesses on the substrate 10 that can be measured. As illustrated in FIG. 14, these measurements provide a way to visually compare a requested resin thickness with a measured resin thickness, as well as estimate calibration linearity.

The calibration graph 1400 includes data points 1402, a fitting line 1404, and its equation 1406. The data points 1402 represent experimental data based on requested resin thickness and measured resin thickness. The fitting line 1404 is a line calculated to fit the data points 1402 as best possible. The slope-intercept equation 1406, $y=1.0001x-0.0007$, is the formula for the fitting line 1404.

As illustrated in FIG. 14, the calibration with randomized pattern 1302 shows a linear trend. This means that drop volume does not change as more nozzles are fired. Here, the method 1200 of randomization leads to linear fluid dispenser response, making the resulting randomized pattern 1302 usable in nanoimprint lithography.

Figure 15:
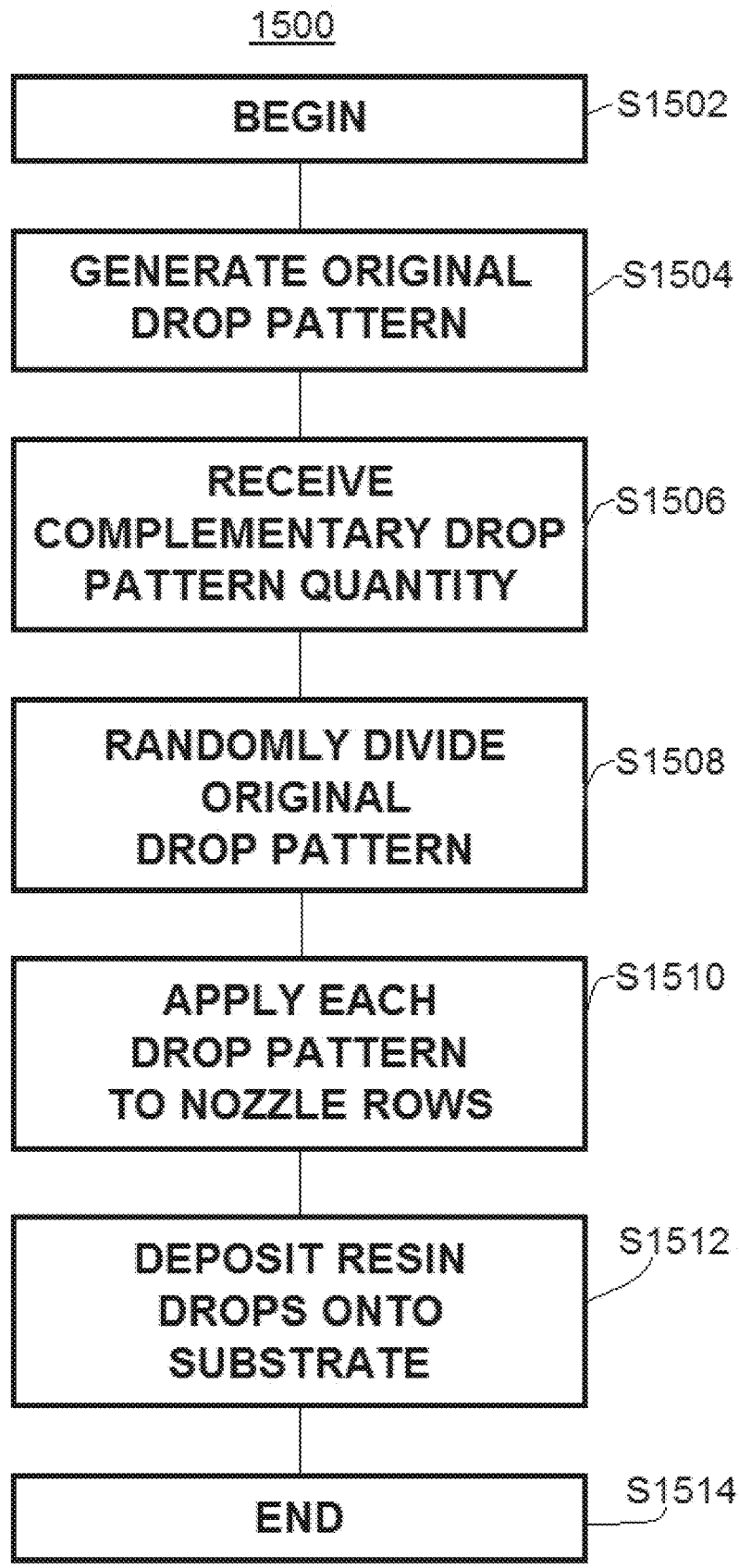
FIG. 15 is a method 1500 to make fluid dispenser response more linear.

FIG. 15 is a method 1500 to make fluid dispenser response more linear. Method 1500 operates to (i) randomly subdivide the original drop pattern into two, three, four or more sub-patterns, and (ii) dispense each random sub-pattern sequentially. As a result, the method 1500 leads to linear fluid dispenser response.

The method 1500 may include dividing a dispense pattern into a plurality of multi-pass dispense patterns to overcome crosstalk and non-linearity. Drops may be dispensed based on applying a drop pattern to fluid dispenser having a plurality of nozzles. The method 1500 begins at step S1502.

Figure 16A:
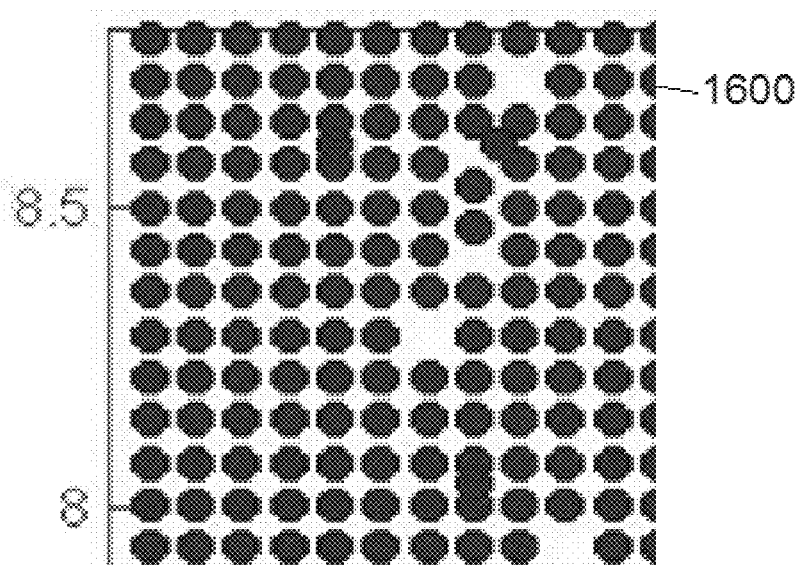
FIG. 16A illustrates an original drop pattern 1600.

At step S1502, the method 1500 may include receiving spatial film thickness pattern information. At step S1504, the control apparatus 200 may execute the drop pattern generating application 214 to generate and output an original drop pattern. FIG. 16A illustrates an original drop pattern 1600. In an example, the drop pattern generating application 214 generated and output the original drop pattern 1600. The original drop pattern 1600 is displayed as filled circles 1600 and, similar to FIG. 13A, is based on the upper left corner portion of the drop pattern 1100 of FIG. 11.

The drop pattern density of the generated original near rectangular drop pattern 1600 may be based on a calibration curve of the drop pattern density relative to a measured thickness of the film generated by the fluid dispenser on a test substrate. The calibration curve is derived using the same method that is described here. From step S1504, method 1500 proceeds to step S1506.

At step S1506, the control apparatus 200 receives input designating the number (N) of complementary drop patterns as a complementary drop pattern quantity by which the original drop pattern is to be divided. The original drop pattern 1600 can be subdivided into N drop sub-patterns, where N=2, 3, 4, . . . or higher. In the present example, the original drop pattern 1600 will be divided into four drop sub-patterns.

Figure 16B:
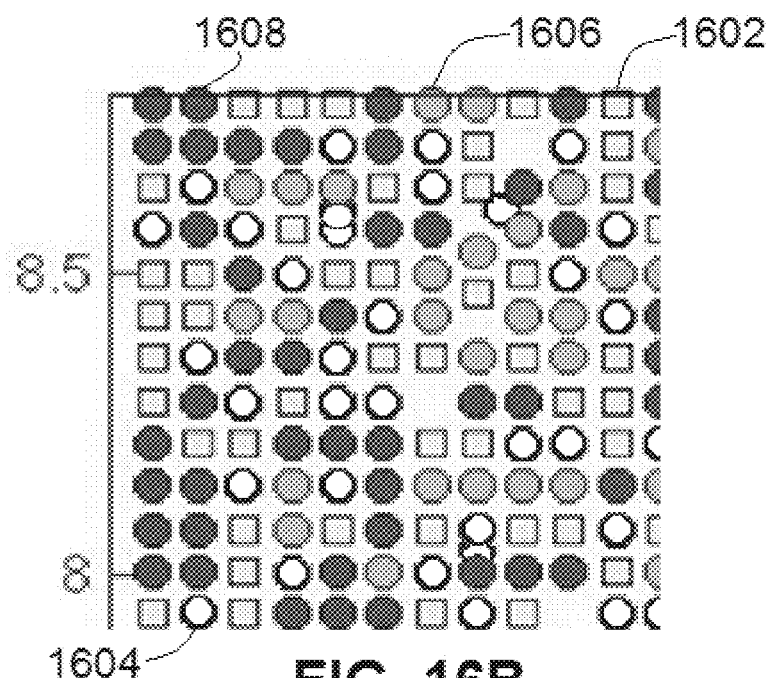
FIG. 16B illustrates multiple sub-patterns from the original drop pattern 1600.

At step S1508, the drop pattern generating application 214 divides the original drop pattern 1600 using a random approach. FIG. 16B illustrates multiple sub-patterns from the original drop pattern 1600. In the example, the drop pattern generating application 214 divided the original drop pattern 1600 using a random approach to generate the multiple sub-patterns illustrated in FIG. 16B.

As noted above, method 800 (FIG. 8) operates to periodically revise a drop pattern that controls fluid dispensers into drop sub-patterns. As comparison, method 1500 operates to randomly revise a drop pattern that controls fluid dispensers into drop sub-patterns. Thus, at step S1508, method 1500 subdivides the original drop pattern 1600 randomly into two, three, four or more sub-patterns. The drops added to each sub-pattern are chosen randomly and so that each sub-pattern has approximately the same number of drops.

In the example, the four resulting sub-patterns of FIG. 16B are a sub-pattern 1602 (solid light gray squares 1602), sub-pattern 1604 (open circles 1604), sub-pattern 1606 (solid gray circles 1606), and sub-pattern 1608 (solid black circles 1608). The quantity of drops in each sub-pattern need not be exactly equal. That is, the number of drops in each sub-pattern may be equal, or not equal depending on the number of drops in the original drop pattern. In this specific example, if the number of drops in the original drop pattern is multiple of 4, then the sub-patterns have the same number of drops. If randomly subdivided as in step S1508, the fluid dispenser 112 simultaneously firing nozzles 118 are arranged compare to each other in a near random way. As such, the appearance of unwanted fluid dispenser resonances is reduced to the minimum.

To perform step S1508, the drop pattern generating application 214 first may generate multi-pass drop sub-patterns from the original drop pattern 1600. The drop pattern generating application 214 may randomly select a drop in the original drop pattern 1600 and assign it to sub-pattern 1602. This drop is then removed from original pattern 1600. Then, the next randomly selected drop from the pattern 1600 is assigned to sub-pattern 1604. This second drop is also removed from the original pattern 1600. The same steps of randomly choosing the drops repeats to assign consequently selected drops in the drop pattern 1600 to sub-pattern 1606, and sub-pattern 1608. The drops are removed from the original drop pattern 1600.

In step S1508, after a drop was assigned to the last (the fourth) drop sub-pattern 1608 in sequence of sub-patterns, the cycle of assignments starts over. The next randomly selected drop in the pattern 1600 is assigned to sub-pattern 1602 again, etc. This exercise continues until the last remaining drop in the pattern 1600 is assigned to either of the sub-patterns. Once no available drops remain in the original drop pattern 1600, the procedure at step S1508 ends.

Among each of the plurality of sub-patterns resulting from step S1508, all values of the drop pattern density for each of the plurality of sub-patterns is within the first range, e.g., 0 nm to 80 nm, and outside of any second range (e.g. 80 nm to 145 nm and greater than 160 nm), where deviation from linearity over the second rage is greater than the predetermined threshold. The method 1500 proceeds from step S1508 to step S1510.

At step S1510, the randomly filled drop sub-patterns are applied to each nozzle row sequentially. In the example, there are four drop sub-patterns and the control apparatus 200 may use four, eight or more passes to deposit the drop sub-patterns one after another in a sequential manner onto the substrate 10. The method 1500 proceeds from step S1510 to step S1512.

At step S1512, the control apparatus 200 performs control to cause each randomly generated sub-pattern to be sequentially dispensed from nozzles 118. In other words, a nozzle row deposits resin drops pass after pass onto a substrate to create a product having the nano-circuit pattern layer 18 on the substrate 10. In the example, the method 1500 dispenses fluid using multiple passes of the fluid dispenser using the random sub-patterns 1602, 1604, 1606, and 1608. Each of the four sub-patterns can take a few passes, for example, two passes. Then, sequentially dispensed and jointed on substrate drop patterns are imprinted on. From step S1512, the method 800 proceeds to step S1514, where the method 1500 ends.

Figure 17:
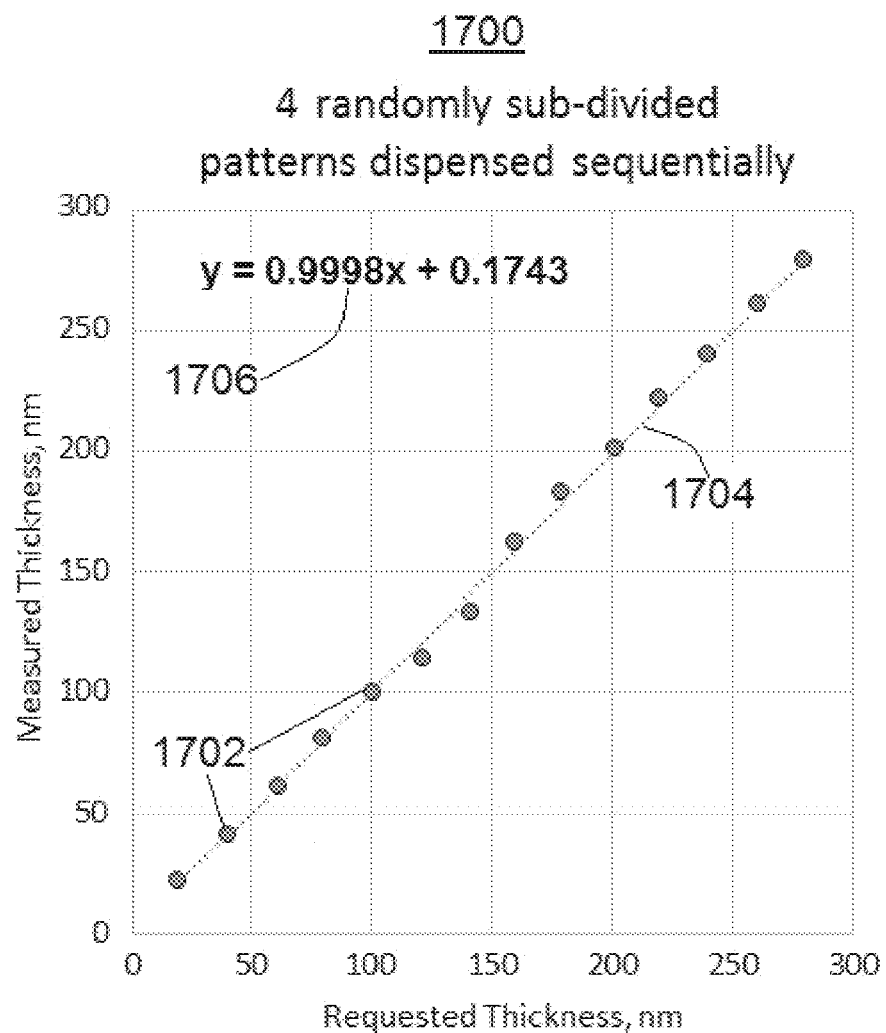
FIG. 17 is a calibration graph 1700 of a result of sequential dispensing of sub-patterns 1602-1608 by a fluid dispenser.

FIG. 17 is a calibration graph 1700 of a result of applying method 1500 of FIG. 15 and sequential dispensing of sub-patterns 1602-1608 by a fluid dispenser. To obtain the results in FIG. 17, random sub-patterns 1602, 1604, 1606, and 1608 were sequentially applying to nozzle rows, which sequentially dispensing the drops onto substrate. The calibration graph 1700 includes data points 1702, a comparison line 1704, and a slope-intercept equation 1706. The data points 1702 represent experimental data based on requested resin thickness and measured resin thickness. The comparison line 1704 is a line calculated to fit the data points 1702 as best as possible. The slope-intercept equation 1706, $y=0.9998x+0.1743$, is the formula for the comparison line 1704.

As illustrated in FIG. 17, the calibration with random patterns 1602, 1604, 1606, and 1608, shows a linear trend that is very close to the slope of the ideal fluid dispenser, namely a slope of 1. This means that drop volume does not change as more nozzles are fired. Here, the method 1500 of random selection leads to linear fluid dispenser response, making the resulting randomly selected pattern 1602, 1604, 1606, and 1608, usable in nanoimprint lithography.

Subdividing an original drop pattern into two, three, four or more sub-patterns as in FIG. 9B (periodic subdivision) and FIGS. 13B and 16B (random subdivision), allows use non-linear fluid dispensers in such a way that they dispense linearly. Dispensing linearly increases accuracy of dispensed volume per unit of area, resulting in better accuracy of replicated features in imprint process, and increased device performance and semiconductor chip yield, respectively.

Figure 18:
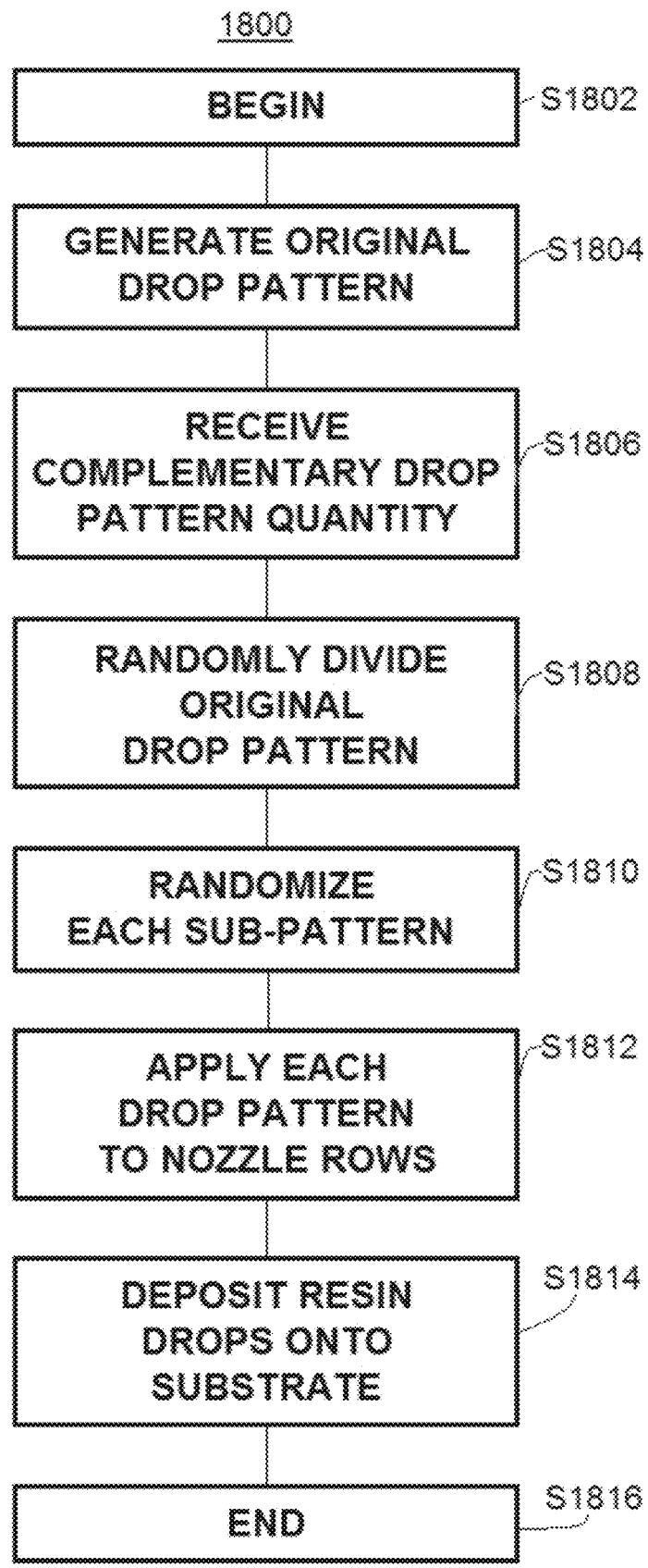
FIG. 18 is a method 1800 to make fluid dispenser response more linear.

FIG. 18 is a method 1800 to make fluid dispenser response more linear. Method 1800 operates to (i) randomly subdivide the original drop pattern into two, three, four or more sub-patterns, (ii) randomize each sub-pattern according to the method 1200, and (iii) dispense each randomized random sub-pattern sequentially. As a result, the method 1800 leads to linear fluid dispenser response.

Figure 19A:
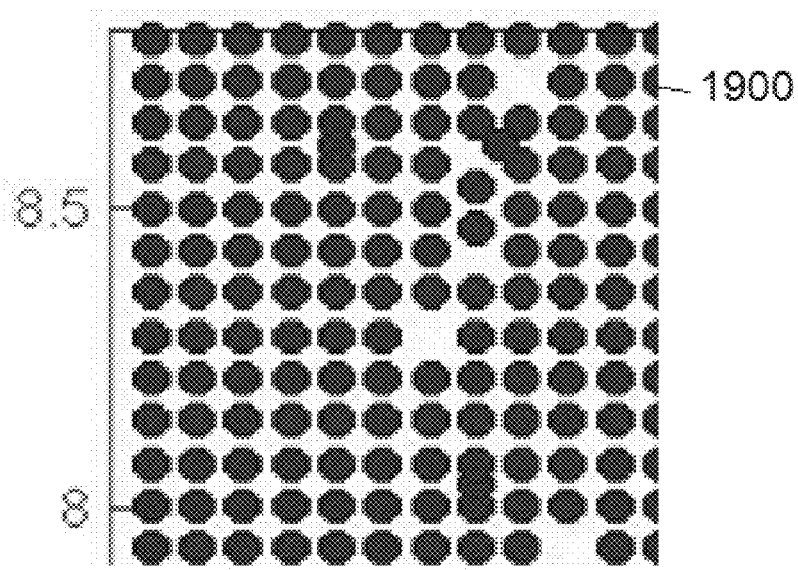
FIG. 19A illustrates an original drop pattern 1900.
Figure 19B:
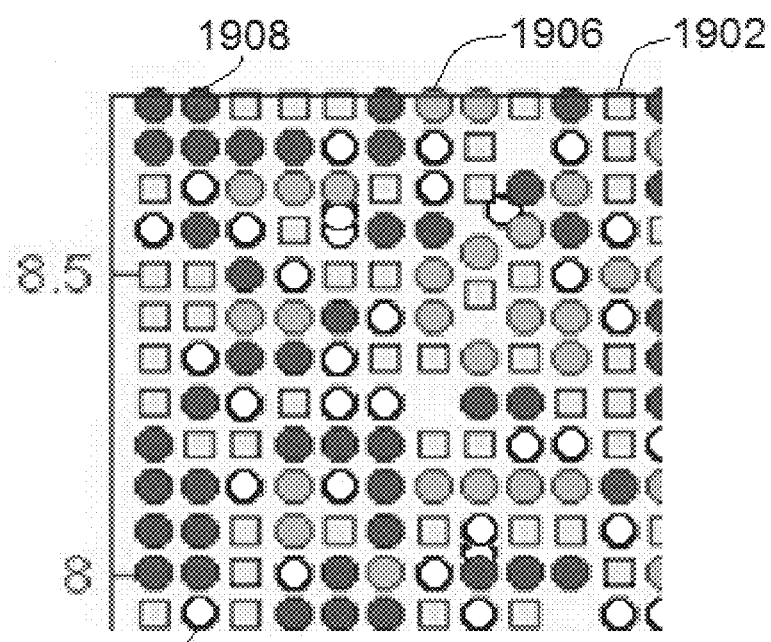
FIG. 19B illustrates multiple sub-patterns from the original drop pattern 1900.

The method 1800 begins with steps S1802, S1804, 51806, and S1808, which are similar to the steps S1502, S1504, S1506, and S1508. FIG. 19A illustrates an original drop pattern 1900. Similar to step S1508, the method 1800 subdivides the original drop pattern 1900 at step S1808 randomly into two, three, four or more sub-patterns. FIG. 19B illustrates multiple sub-patterns from the original drop pattern 1900. The multiple sub-patterns of FIG. 19B are comparable to the multiple sub-patterns of FIG. 16B. The drops added to each sub-pattern of FIG. 19B are chosen randomly and chosen so that each sub-pattern has approximately the same number of drops.

At step S1810, the method 1800 randomizes each newly created sub-pattern. In an example, the method 1800 randomizes each sub-pattern 1902, 1904, 1906, and 1908 in a way that is similar to the randomization in step S1206 of method 1200 in FIG. 12.

Figure 19C:
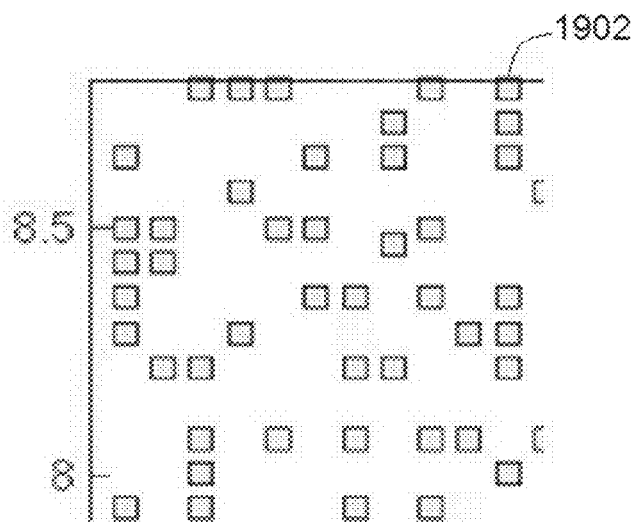
FIGS. 19C, 19D, and 19E illustrate randomization of the sub-pattern 1902 according to the method 1800 in FIG. 18.
Figure 19D:
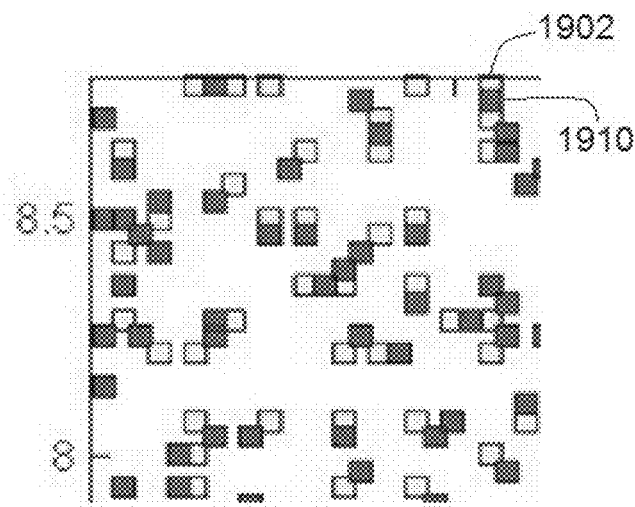
Figure 19E:
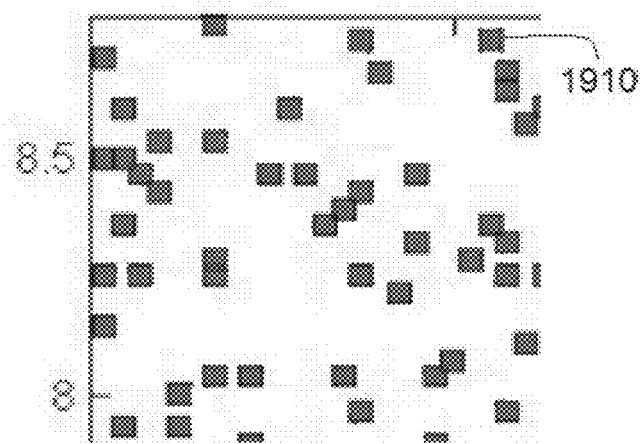

FIGS. 19C to 19E illustrate randomization of the sub-pattern 1902 according to the method 1800 in FIG. 18. FIG. 19C illustrates the sub-pattern 1902 (solid light gray squares 1902) isolated from sub-patterns 1904, 1906, and 1908 shown in FIG. 19B. To randomize the sub-pattern 1902 illustrated in FIG. 19C, each drop in the pattern may be arbitrarily displaced by +1 unit or −1 unit in vertical, horizontal, or diagonal directions, where 1 unit is smallest distance a fluid dispenser can dispense the drops apart. FIG. 19D illustrates superposition of randomized sub-pattern 1910 (solid black squares 1910) that originated from sub-pattern 1904 (open circles 1904 in FIG. 19B) in some pattern area. FIG. 19E illustrates drops of the new sub-pattern 1910 only.

Similar to step S1206, the randomization at step S1810 can result in the drop being re-located into one of nine positions within a 3×3 grid. The original drop sub-patterns 1902, 1904, 1906, and 1908 can lead to randomized drop sub-pattern 1910 and three randomized sub-patterns that correspond to sub-patterns 1904, 1906, and 1908. The method 1800 proceeds from step S1810 to step S1812.

At step S1812, the randomized drop sub-patterns are applied to each nozzle row sequentially. In the example, there are four drop sub-patterns and the control apparatus 200 may use four, eight or more passes to deposit the drop sub-patterns one after another in a sequential manner onto the substrate 10. The method 1800 proceeds from step S1812 to step S1814.

At step S1814, the control apparatus 200 performs control to cause each randomized random sub-pattern to be sequentially dispensed from nozzles 118. In other words, a nozzle row deposits resin drops pass after pass onto a substrate to create a product having the nano-circuit pattern layer 18 on the substrate 10. In the example, the method 1800 dispenses fluid using multiple passes of the fluid dispenser using the randomized sub-pattern 1910 and three randomized sub-patterns that correspond to sub-patterns 1904, 1906, and 1908. Each of the four sub-patterns can take a few passes, for example, two passes. Then, sequentially dispensed and jointed on substrate drop patterns are imprinted on. From step S1814, the method 800 proceeds to step S1816, where the method 1800 ends.

Figure 20:
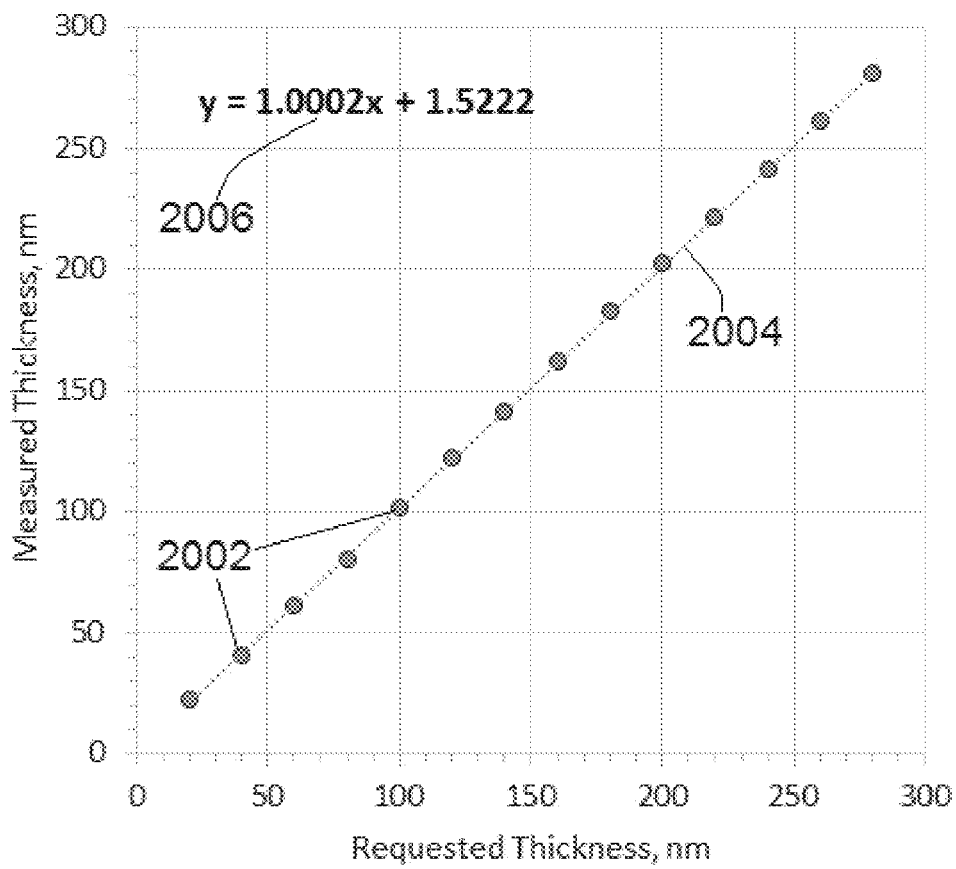
FIG. 20 is a calibration graph 2000 of a result of sequential dispensing of sub-patterns 1902-1908 by a fluid dispenser.

FIG. 20 is a calibration graph 2000 of a result of sequential dispensing of sub-patterns 1902-1908 by a fluid dispenser. The calibration graph 2000 is a result of sequentially applying randomized sub-pattern 1910, and three randomized sub-patterns that correspond to sub-patterns 1904, 1906, and 1908, to nozzle rows and sequentially dispensing the drops onto substrate. The calibration graph 2000 includes data points 2002, a comparison line 2004, and a slope-intercept equation 2006. The data points 2002 represent experimental data based on requested resin thickness and measured resin thickness. The comparison line 2004 is a line calculated to fit the data points 2002 as best as possible. The slope-intercept equation 2006, y=1.0002x+1.5222, is the formula for the comparison line 2004.

As illustrated in FIG. 20, the calibration with randomized pattern 1910, and three randomized sub-patterns that correspond to sub-patterns 1904, 1906, and 1908, shows a linear trend having a slope of 1.0002, which is very close to the slope of the ideal fluid dispenser, namely a slope of 1. This means that drop volume does not change as more nozzles are fired. Here, the method 1800 of randomization leads to linear fluid dispenser response, making the resulting randomized pattern 1910, and three randomized sub-patterns that correspond to sub-patterns 1904, 1906, and 1908, usable in nanoimprint lithography.

A manufacturing method of a product having a nano-circuit pattern layer 18 on the substrate 10 serving as an article will be described. The manufacturing method may include forming a pattern or a planar layer on a substrate (a wafer, a glass plate, a film-like substrate, or the like) using an imprint template or a superstrate by the apparatus or method described above. The manufacturing method further may include processing the substrate on which the pattern or the planar layer has been formed. The processing can include removing a residual film of the pattern or etching the substrate using the pattern as a mask.

The manufacturing method may use the control apparatus 200 to obtain a dispense pattern output from the drop pattern generating application 214. The obtained dispense pattern then is modified into a modified dispense pattern.

In a case where the control apparatus 200 utilizes a complementary drop pattern quantity, the obtained dispense pattern can be divided into a plurality of dispense patterns (Method 800 FIG. 8) or can be randomly divided into a plurality of randomly dispensing patterns (Method 1500 FIG. 15), where the plurality of randomly dispensing patterns can be randomized into a plurality of randomized randomly divided dispense patterns (Method 1800 FIG. 18). In a case where the control apparatus 200 does not utilize a complementary drop pattern quantity, the obtained dispense pattern can be randomized into a second dispense pattern (Method 1200 FIG. 12).

After modifying the obtained dispense pattern, the modified dispense pattern is substituted in place of the obtained dispense pattern for use in dispensing drops onto the substrate 10. For example, the plurality of dispense patterns, the plurality of randomly divided dispense patterns, the plurality of randomized randomly divided dispense patterns, or the second dispense pattern can be substituted in place of the obtained dispense pattern. The control apparatus 200 then can apply the modified dispense pattern to the fluid dispenser 112 (FIG. 1) having a plurality of nozzles 118 to dispense drops onto the substrate 10 to produce, as an article, the product having a nano-circuit pattern layer 18 on the substrate 10. The method of manufacturing the article exceeds conventional methods in at least one of the performance, quality, productivity, and production cost of the article.

The four methods discussed were method 800, method 1200, method 1500, and method 1800. Subdividing an original drop pattern into two, three, four or more sub-patterns as in FIG. 9B (Method 800 periodic subdivision), FIG. 13B (Method 1200 randomization), FIG. 16B (Method 1500 random subdivision), and FIGS. 19C to 19E (Method 1800 randomized random subdivision) allows use non-linear fluid dispensers in such a way that they dispense more linearly than conventional approaches. As fluid is dispensed more linearly increases accuracy of dispensed volume per unit of area, resulting in better accuracy of replicated features in imprint process, and increased device performance and semiconductor chip yield, respectively.

Method 800 (FIG. 8) is beneficial in that the distance between firing nozzles is increased, which works towards reducing or eliminating fluid dispenser mechanical resonance. Depending on number of sub-patterns the number of drop dispensed correspondingly increase. Method 1200 (FIG. 12) includes randomizing the original drop pattern into a second drop pattern. Only one dispense event with multiple passes is necessary in method 1200. Method 1500 (FIG. 15) included randomly dividing the original drop pattern, whereas method 1800 (FIG. 1800) included both randomly dividing the original drop pattern and then randomizing each random sub-pattern.

For method 800, the slope in the slope-intercept equation 1036 was 1.0919 (see FIG. 10). For method 1200, the slope in the slope-intercept equation 1406 was 1.0001 (see FIG. 14). For method 1500, the slope in the slope-intercept equation 1706 was 0.9998 (see FIG. 17). Moreover, for method 1800, the slope in the slope-intercept equation 2006 was 1.002 (see FIG. 20). Each of these four methods are sufficiently close to the ideal fluid dispenser slope of 1 to be usable in nanoimprint lithography to suppress unexpected variation in the resist layer thickness and avoid downstream process defects. These methods work towards increasing device performance and semiconductor chip yield.

The above embodiments may be carried out in the case where programs that achieve the functions according to the above embodiments are supplied to a system or an apparatus via a network or a storage medium and processors of a computer of the system or the apparatus perform the programs. The above embodiments can be carried out also by using a circuit (for example, application specific integrated circuit (ASIC)) having the functions.

Embodiment(s) can also be realized by a computer of a system or apparatus that reads out and executes computer executable instructions (e.g., one or more programs) recorded on a storage medium (which may also be referred to more fully as a 'non-transitory computer-readable storage medium') to perform the functions of one or more of the above-described embodiment(s) and/or that includes one or more circuits (e.g., ASIC) for performing the functions of one or more of the above-described embodiment(s), and by a method performed by the computer of the system or apparatus by, for example, reading out and executing the computer executable instructions from the storage medium to perform the functions of one or more of the above-described embodiment(s) and/or controlling the one or more circuits to perform the functions of one or more of the above-described embodiment(s). The computer may include one or more processors (e.g., central processing unit (CPU), micro processing unit (MPU)) and may include a network of separate computers or separate processors to read out and execute the computer executable instructions. The computer executable instructions may be provided to the computer, for example, from a network or the storage medium. The storage medium may include, for example, one or more of a hard disk, a random-access memory (RAM), a read only memory (ROM), a storage of distributed computing systems, an optical disk (such as a compact disc (CD), digital versatile disc (DVD), or Blu-ray Disc (BD)™), a flash memory device, a memory card, and the like.

What is claimed is:

1. A method of controlling a control apparatus for use with a fluid dispenser having a plurality of nozzles, the method comprising:
    obtaining, as data, a drop pattern for use in dispensing drops onto a substrate from the fluid dispenser, wherein in a case where the drop pattern is applied, applying the drop pattern results in a first level of crosstalk between the plurality of nozzles;
    modifying the obtained drop pattern into a modified drop pattern, wherein, in a case where the modified drop pattern is applied, applying the modified drop pattern results in a second level of crosstalk between the plurality of nozzles that is less than the first level of crosstalk; and
    substituting the modified drop pattern in place of the obtained drop pattern to dispense the drops onto the substrate from the fluid dispenser.

2. The method according to claim 1,
    wherein, in a case where the control apparatus utilizes a complementary drop pattern quantity, modifying includes dividing the obtained drop pattern into a plurality of drop patterns, and
    wherein, in a case where the control apparatus does not utilize a complementary drop pattern quantity, modifying includes randomizing the drop pattern into a second drop pattern.

3. The method according to claim 2, wherein, in the case where the control apparatus utilizes the complementary drop pattern quantity, dividing the obtained drop pattern includes randomly dividing the obtained drop pattern into a plurality of randomly divided drop patterns.

4. The method according to claim 3, wherein, after randomly dividing the obtained drop pattern and in the case where the control apparatus utilizes the complementary drop pattern quantity, modifying includes randomizing each of the plurality of randomly divided drop patterns into a plurality of randomized randomly divided drop patterns.

5. The method according to claim 4, wherein substituting the modified drop pattern includes substituting one of the following: the plurality of drop patterns, the second drop pattern, the plurality of randomly divided drop patterns, or the plurality of randomized randomly divided drop patterns, the method further comprising applying each pattern to a nozzle row to produce a product having a nano-circuit pattern layer on the substrate by depositing drops onto the substrate according to each pattern.

6. A method of manufacturing an article, the method comprising:
   obtaining, as data, a drop pattern output from a drop pattern generating application wherein in a case where the drop pattern is applied, applying the drop pattern results in a first level of crosstalk between a plurality of nozzles;
   modifying the obtained drop pattern into a modified drop pattern, wherein, in a case where the modified drop pattern is applied, applying the modified drop pattern results in a second level of crosstalk between the plurality of nozzles that is less than the first level of crosstalk;
   substituting the modified drop pattern in place of the obtained drop pattern for use in dispensing drops onto a substrate; and
   applying the modified drop pattern to a fluid dispenser having a plurality of nozzles to dispense drops onto a substrate from the fluid dispenser to produce an article of a pattern layer on the substrate.

7. The method of claim 6,
wherein, in a case where the method utilizes a complementary drop pattern quantity, the obtained drop pattern is one of: divided into a plurality of drop patterns, randomly divided into a plurality of randomly dispensing patterns, or randomizing the plurality of randomly dispensing patterns into a plurality of randomized randomly divided drop patterns, and
wherein, in a case where the method does not utilize a complementary drop pattern quantity, the obtained drop pattern is randomized into a second drop pattern.

8. The method according to claim 6,
wherein, in the case where the drop pattern is applied, applying the drop pattern further results in a first level of non-linearity of a dispensed drop volume, and
wherein, in the case where the modified drop pattern is applied, applying the modified drop pattern results in a second level of non-linearity of the dispensed drop volume that is less than the first level of non-linearity of the dispensed drop volume.

9. The method according to claim 1,
wherein, in the case where the drop pattern is applied, applying the drop pattern further results in a first level of non-linearity of a dispensed drop volume, and
wherein, in the case where the modified drop pattern is applied, applying the modified drop pattern results in a second level of non-linearity of the dispensed drop volume that is less than the first level of non-linearity of the dispensed drop volume.

* * * * *